US009214901B2

(12) United States Patent
Owen

(10) Patent No.: US 9,214,901 B2
(45) Date of Patent: Dec. 15, 2015

(54) WIDEBAND AFT POWER AMPLIFIER SYSTEMS WITH FREQUENCY-BASED OUTPUT TRANSFORMER IMPEDANCE BALANCING

(71) Applicant: MKS Instruments, Inc., Andover, MA (US)

(72) Inventor: Christopher Michael Owen, Pittsford, NY (US)

(73) Assignee: MKS Instruments, Inc., Andover, MA (US)

( * ) Notice: Subject to any disclaimer, the term of this patent is extended or adjusted under 35 U.S.C. 154(b) by 92 days.

(21) Appl. No.: 13/834,965

(22) Filed: Mar. 15, 2013

(65) Prior Publication Data

US 2014/0028398 A1 Jan. 30, 2014

Related U.S. Application Data

(60) Provisional application No. 61/676,633, filed on Jul. 27, 2012.

(51) Int. Cl.
*H03F 3/26* (2006.01)
*H03F 3/193* (2006.01)
*H03F 3/24* (2006.01)
*H03F 3/60* (2006.01)

(52) U.S. Cl.
CPC .............. *H03F 3/193* (2013.01); *H03F 3/245* (2013.01); *H03F 3/265* (2013.01); *H03F 3/602* (2013.01)

(58) Field of Classification Search
CPC ........................................................ H03F 3/26
USPC ................ 330/276, 165, 295, 124 R
See application file for complete search history.

(56) References Cited

U.S. PATENT DOCUMENTS

| 3,493,878 A | 2/1970 | Fautale |
| 3,636,380 A | 1/1972 | Anderson |
| 3,899,745 A | 8/1975 | Fletcher et al. |

(Continued)

FOREIGN PATENT DOCUMENTS

| JP | 57-157608 | 9/1982 |
| JP | 01-280908 | 11/1989 |

(Continued)

OTHER PUBLICATIONS

Japanese Office Action for Application No. 2013-156519 dated Aug. 26, 2014, and its English translation thereof.

*Primary Examiner* — Henry Choe
(74) *Attorney, Agent, or Firm* — Harness, Dickey & Pierce, P.L.C.

(57) ABSTRACT

A radio frequency system includes a first power splitter, a first push-pull power amplifier and a second push-pull power amplifier. The first power splitter is configured to receive a first radio frequency signal and generate a first output signal and a second output signal. The first push-pull power amplifier is configured to amplify the first output signal. The first push-pull power amplifier comprises a first set of transistors including at least two radio frequency power transistors and a first output transformer. The second push-pull power amplifier is configured to amplify the second output signal. The second push-pull power amplifier includes a second set of transistors including at least two radio frequency power transistors and a second output transformer. An output of the first transformer is galvanically and directly connected to an output of the second output transformer.

33 Claims, 19 Drawing Sheets

(56) References Cited

U.S. PATENT DOCUMENTS

| | | |
|---|---|---|
| 3,939,380 A | 2/1976 | Peer |
| 4,021,748 A | 5/1977 | Yoshida et al. |
| 4,042,890 A | 8/1977 | Eckerle |
| 4,047,120 A | 9/1977 | Lord et al. |
| 4,067,057 A | 1/1978 | Taddeo et al. |
| 4,173,739 A | 11/1979 | Yoshida |
| 4,182,992 A | 1/1980 | Attwood |
| 4,268,898 A | 5/1981 | Brown |
| 4,408,267 A | 10/1983 | Pruitt |
| 4,429,339 A | 1/1984 | Jaeschke et al. |
| 4,455,600 A | 6/1984 | Bobry |
| 4,509,101 A | 4/1985 | Kenji |
| 4,511,823 A | 4/1985 | Eaton et al. |
| 4,550,359 A | 10/1985 | West |
| 4,560,851 A | 12/1985 | Tsukamoto et al. |
| 4,564,879 A | 1/1986 | Bienstman |
| 4,600,891 A | 7/1986 | Taylor, Jr. et al. |
| 4,639,849 A | 1/1987 | Noworolski et al. |
| 4,670,832 A | 6/1987 | Park |
| 4,691,270 A | 9/1987 | Pruitt |
| 4,709,323 A | 11/1987 | Lien |
| 4,719,556 A | 1/1988 | Wise |
| 4,720,775 A | 1/1988 | Cathell |
| 4,725,762 A | 2/1988 | Jagschitz et al. |
| 4,739,463 A | 4/1988 | Barna et al. |
| 4,745,537 A | 5/1988 | Cheung et al. |
| 4,910,416 A | 3/1990 | Salcone |
| 4,914,399 A | 4/1990 | Doany |
| 4,992,749 A | 2/1991 | Tokumo et al. |
| 5,019,770 A | 5/1991 | Harada et al. |
| 5,023,566 A | 6/1991 | El-Hamamsy et al. |
| 5,117,167 A | 5/1992 | Kazmirski |
| 5,117,198 A | 5/1992 | Morenz |
| 5,187,580 A | 2/1993 | Porter, Jr. et al. |
| 5,196,995 A | 3/1993 | Gulczynski |
| 5,218,315 A | 6/1993 | Turner |
| 5,367,228 A | 11/1994 | Kachmarik et al. |
| 5,471,376 A | 11/1995 | Tsai et al. |
| 6,157,258 A * | 12/2000 | Adishian et al. ............. 330/295 |
| 7,486,141 B2 * | 2/2009 | Do et al. ...................... 330/276 |
| 2014/0132352 A1 * | 5/2014 | Hansen ......................... 330/295 |

FOREIGN PATENT DOCUMENTS

| | | |
|---|---|---|
| JP | 03-250807 | 11/1991 |
| JP | 2007-066778 | 3/2007 |
| JP | 2012-005077 | 1/2012 |
| WO | 2011064306 A1 | 6/2011 |

* cited by examiner

WIDEBAND AFT POWER AMPLIFIER SYSTEMS WITH FREQUENCY-BASED OUTPUT TRANSFORMER IMPEDANCE BALANCING

CROSS-REFERENCE TO RELATED APPLICATIONS

This application claims the benefit of U.S. Provisional Application No. 61/676,633, filed on Jul. 27, 2012. The entire disclosure of the above application is incorporated herein by reference.

FIELD

The present disclosure relates to power amplifiers, and more particularly to power amplifiers with wideband operation and/or having characteristics of more than one class of amplifier.

BACKGROUND

This section provides background information related to the present disclosure which is not necessarily prior art.

Various industries use radio frequency (RF) energy to drive plasma chambers in order to fabricate various components such as integrated circuits, solar panels, compact disks (CDs), digital versatile (or video) discs (DVDs), and the like. Each fabrication process can vary depending upon the particular component being manufactured. The various processes often call for delivery of RF energy at varying frequencies, power levels, and efficiencies.

Traditionally, RF power delivery systems were each designed to satisfy requirements of a particular plasma manufacturing process. RF power amplifiers (PAs) and generators were thus not interchangeable or easily modified to accommodate various applications with different requirements. A variable class amplifier system (sometimes referred to as a Class O amplifier) has been introduced, which may be used to satisfy different classes of operation. The variable class amplifier system may be used to satisfy, for example, Class AB operation, Class E operation and classes between Class AB and Class E.

A variable class amplifier system may include, for example, two PA boards. Each of the PA boards may have a predetermined number of PAs (e.g., 4 PAs). Each PA has a respective capacitor-inductor-capacitor (CLC) network. The CLC networks are used to provide a selected class of operation. Each CLC network includes two capacitors and an inductor. As an example, a first capacitance of each of the CLC networks is connected between an output of a respective PA and a ground reference. The inductance of each of the CLC networks is connected between (i) the output of the respective PA and the first capacitance, and (ii) the second capacitance. The second capacitance is connected between the inductance and the ground reference.

The operating class of the variable class amplifier system may be adjusted by adjusting the capacitance and inductance values of each of the CLC networks. For example, the second capacitance values of the CLC networks may be increased for Class E operation. The second capacitance values of the CLC networks may be decreased for Class AB operation.

During class AB operation, transistor conduction angles of the PAs may be between 180-360°. Approximately half of the input wave cycle is amplified by a first switch, and the other half of the input wave cycle is amplified by a second switch operating in a complementary manner. Class AB operation is typically exemplified by each switch conducting a small amount during portions of cycles when the switches are generally OFF. This reduces dead zones, or periods when both switches are OFF, which minimizes or eliminates crossover. Class AB amplifiers typically have power efficiencies between 50-78.5%. In conventional PAs, class AB power efficiency can be limited to approximately 70%.

An ON state of a Class E amplifier occurs when voltage is at or near zero across a switch and when a high level of current is flowing through the switch. An OFF state of a Class E amplifier occurs when the voltage across the switch is at a high level and when current flowing through the switch is at or near zero. Thus, the switch performs as a low-resistance closed switch during an ON part of a RF cycle, and performs as an open switch during an OFF part of the RF cycle. Class E amplifiers can have efficiencies between 85-95%, but tend to exhibit a reduced amount of power output and/or linearity as compared to Class AB amplifiers.

Although the variable class amplifier system may be used to satisfy different classes of operation, the variable class amplifier system is susceptible to power output variations and current variations due to changes in input frequency. Certain PA applications experience wideband frequency operation due to automatic frequency tuning (AFT). Wideband frequency operation refers to an oscillation and/or change in an input frequency of a power amplifier system. The change in frequency may be, for example, ±5% from a center frequency. As an example, for a center frequency of 60 megahertz (MHz), an operating frequency range may be 57-63 MHz. This change in input frequency can result in impedance variations in transistors, transformers, and CLC networks of a power amplifier system. The impedances variations cause the variations in the RF output power and the PA power supply current with frequency, which negatively affects system operating efficiencies.

SUMMARY

This section provides a general summary of the disclosure, and is not a comprehensive disclosure of its full scope or all of its features.

A radio frequency system is provided and includes a first power splitter, a first push-pull power amplifier and a second push-pull power amplifier. The first power splitter is configured to receive a first radio frequency signal and generate a first output signal and a second output signal. The first push-pull power amplifier is configured to amplify the first output signal. The first push-pull power amplifier comprises a first set of transistors including at least two radio frequency power transistors and a first output transformer. The second push-pull power amplifier is configured to amplify the second output signal. The second push-pull power amplifier includes a second set of transistors including at least two radio frequency power transistors and a second output transformer. An output of the first transformer is galvanically and directly connected to an output of the second output transformer.

In other features, a radio frequency amplifier system is provided and includes an input module and a set of power amplifiers. The input module is configured to receive and amplify an input signal to generate an amplified output signal. A frequency of the input signal varies within a predetermined frequency range. Each of the first set of power amplifiers includes an output and is configured to receive the amplified output signal. The outputs are galvanically and directly connected to each other at a first output terminal. Power from the first set of power amplifiers is supplied to a load via the first output terminal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example implementations are provided so that this disclosure will be thorough, and will fully convey the scope to those who are skilled in the art. Numerous specific details are set forth such as examples of specific components, devices, and methods, to provide a thorough understanding of implementations of the present disclosure. It will be apparent to those skilled in the art that specific details need not be employed, that example implementations may be embodied in many different forms and that neither should be construed to limit the scope of the disclosure. In some example implementations, well-known processes, well-known device structures, and well-known technologies are not described in detail.

The implementations disclosed herein include radio frequency (RF) amplifier systems with power amplifier module architectures that include direct galvanic combining of outputs of power amplifiers (e.g., push-pull power amplifiers). Each of the power amplifiers may include multiple high power high gain RF transistors connected to respective output transformers. Outputs of the output transformers of two or of the power amplifiers may be galvanically combined, as further described below. The power amplifier modules and/or power amplifiers exhibit wide bandwidths for automatic frequency tuning (AFT) and very high frequency (VHF) applications. These implementations provide flat, AFT bandwidths, efficient variable class operation, system stability with low spurious outputs for loads exhibiting open and short circuits with any phase angles, as well as rectangular pulse shape characteristics for pulsing applications. This stability is provided during pulsing applications. The implementations minimize system complexity while providing increased system reliability. System size is minimized while providing high power density. Although the implementations and architectures disclosed herein are primarily described with respect to certain high frequency (HF) and VHF frequencies and/or frequency ranges, the implementations and architectures may be applied to other frequencies and/or frequency ranges of operation.

Figure 2:
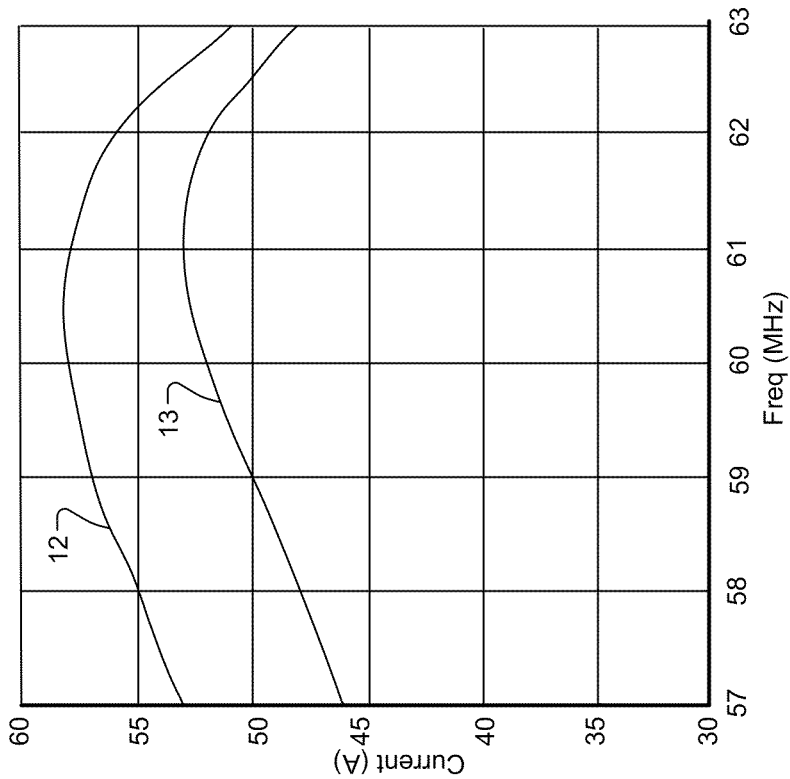
FIG. 2 is an example current versus frequency plot for power amplifiers of the traditional variable class amplifier system.
Figure 1:
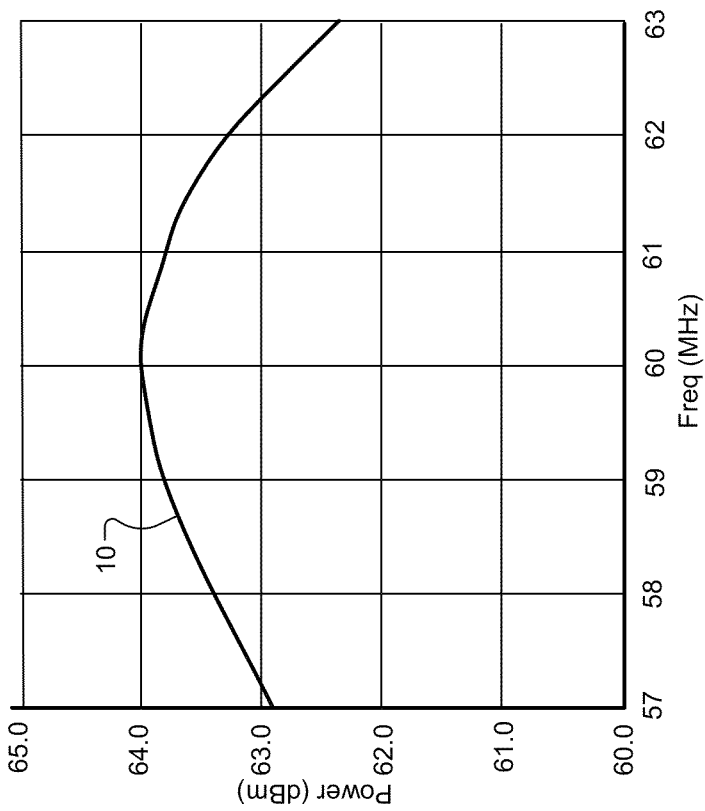
FIG. 1 is a power output versus frequency plot for a power amplifier module of a traditional variable class amplifier system.

In FIGS. 1 and 2, example power and current versus frequency plots for a power amplifier (PA) module and PAs of a traditional variable class amplifier system are shown. In FIG. 1, a power output curve 10 for a PA module is shown. A PA module may have, for example, four PAs (or set of PAs) connected in a parallel configuration. The power output varies over a variation in frequency of an input signal received by the variable class amplifier system. The frequency is varied ±5% from a center frequency of 60 MHz or 57-63 MHz. The power output may vary about 46% (1.6 dB) over the frequency range of 57-63 MHz. The implementations disclosed below provide reduced power output variation.

Figure 3:
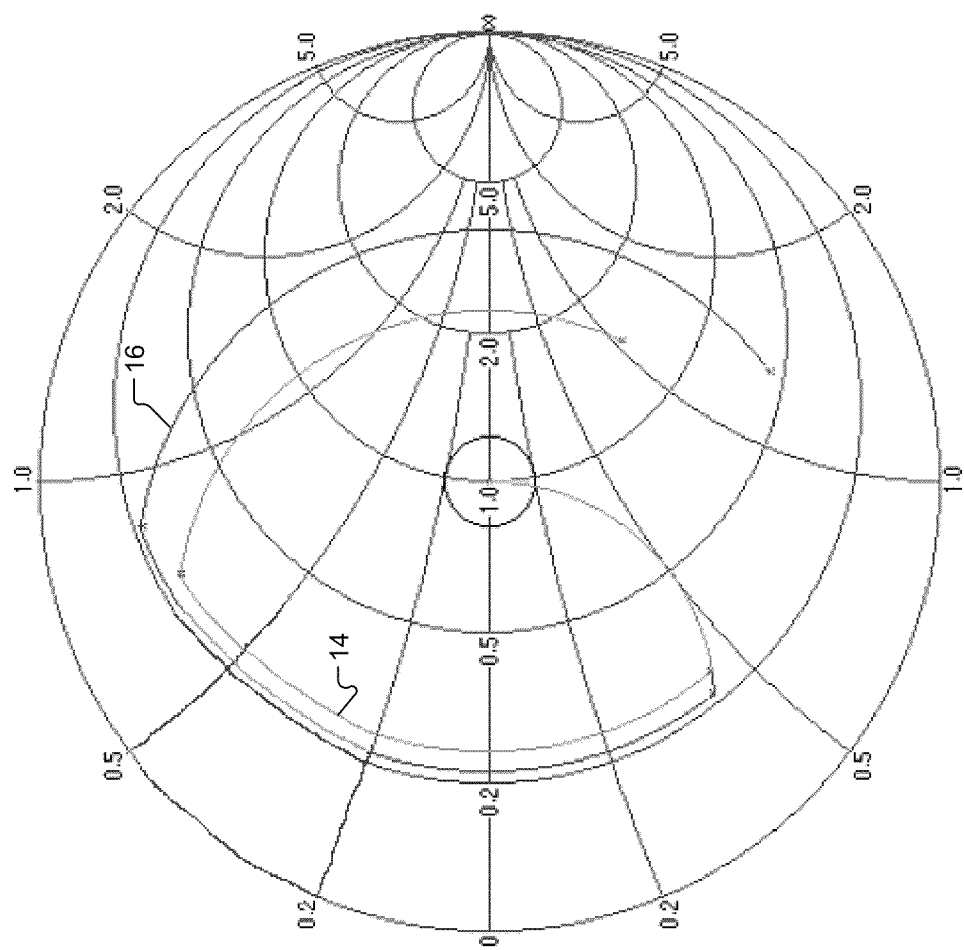
FIG. 3 is a Smith chart illustrating impedance variation for a CLC network of a PA output of the traditional variable class amplifier system.

In FIG. 2, two current curves 12, 13 representing direct current (DC) or supply current used by a pair of PAs are shown. The first current curve 12 represents supply current when the PAs are operated at a power output saturation level. The second current curve 13 represents the supply current when the PAs are not operated at a power output saturation level, but rather are operated at a 1 dB compression point. Based on these curves, the supply current may vary about 14% over the 57-63 MHz frequency operating range regardless of whether the PAs are operating at a power output saturation level. The variance in the power output and the supply current of a PA module and/or of PAs occurs due to changes in impedances of transistors, transformers, capacitances, and inductances of the PAs. Example changes in impedances as seen by the transistors of the PAs are shown in FIG. 3. Variances in power output and supply current negatively affect efficiencies of a variable class amplifier system.

In FIG. 3, a Smith chart is shown illustrating example impedance variation for a CLC network of a PA output of the traditional variable class amplifier system for two frequencies. Real and imaginary impedance curves 14, 16 are shown for the variable class amplifier system operating at different frequencies. The first impedance curve 14 may be, for example, when the traditional variable class amplifier system receives an input signal of 57 MHz. The second impedance curve 16 may be, for example, when the traditional variable class amplifier system receives an input signal of 63 MHz. The impedance curves 14, 16 are divided into curved segments. Normalized points between the segments refer to impedances at different points along a CLC network of a PA. The curves 14, 16 include 3 segments associated with the respective impedances of the capacitances and inductance in the CLC network.

The traditional variable class amplifier system exhibits large impedance variations at least partially due to a capacitance-inductance-capacitance (CLC) network per PA output. As an example, a traditional variable class amplifier system receiving an input signal with a center frequency of 60 MHz and varying in frequency ±5% may exhibit a load line impedance variation of 50% over the operating bandwidth (57-63 MHz). The load line impedance for the traditional variable class amplifier may refer to an impedance at an output of a transmission line of a PA including impedances of a CLC network. As a result, the traditional variable class amplifier system may only be used as a narrow band system and may not be suitable for AFT applications. The CLC network may contribute more impedance variation than other impedance variations of an amplifier system combined.

Amplifier systems are disclosed below that eliminate and/or minimize the use of CLC networks while providing wideband operation. The amplifier systems may operate at or near a Class AB mode, a Class E mode, a mode between Class AB and E, and/or may operate in a Class O mode. In the Class O mode, an amplifier system operates as a variable class amplifier system having impedances, which may be modified as described below to operate at or near the Class AB mode, the Class E mode or a mode between Class AB and E.

Unexpected results were obtained and/or various features are provided by output network configurations of the amplifier systems disclosed herein. CLC networks and/or impedances are eliminated, minimized (in size and quantity), and/or modified while maintaining a minimal amount of impedance transformations and satisfying power output, gain and supply current requirements. Example power output, gain and supply current requirements may include a minimum power output, a minimum amount of gain, a maximum amount of supply current, a maximum amount of power output variation over an AFT operating range, a maximum amount of gain variation over an AFT operating range and/or a maximum amount of supply current variation over an AFT operating range. The unexpected results and/or various features include minimal variations in PA module power output, PA gain and PA supply current over an AFT bandwidth of a RF amplifier system.

Although the amplifier systems are described as operating in a particular frequency range and/or at particular frequencies, the amplifier systems may operate below, in, and/or above a VHF range. The VHF range may be, for example, 30-300 MHz. Also, although the amplifier systems are described as receiving input signals having certain frequencies, the received input signals may have frequencies below, in and/or above the VHF range.

Figure 4:
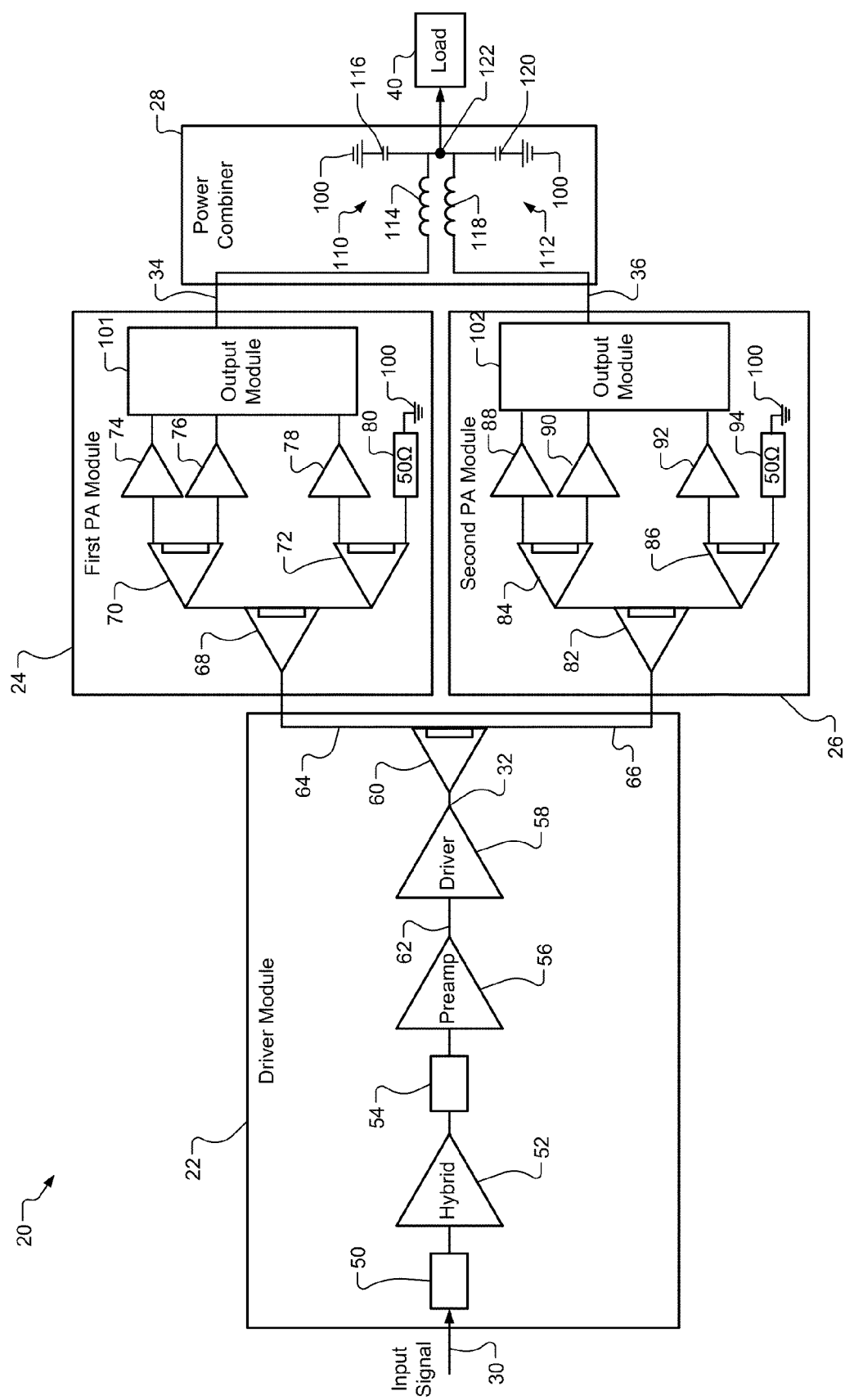
FIG. 4 is a block and schematic diagram of a radio frequency amplifier system with a tri-power amplifier configuration operating in a first frequency range in accordance with the present disclosure.

In FIG. 4, a radio frequency (RF) amplifier system 20 is shown. The RF amplifier system 20 includes a driver module 22, multiple power amplifier (PA) modules 24, 26, and a power combiner 28. The driver module 22 receives an input signal 30 with a center frequency. The RF amplifier system 20 may be applicable to various operating frequencies including any of the operating frequencies disclosed herein. Components of the power amplifier modules 24, 26 may be different for different operating frequencies and/or frequency ranges, as is further disclosed herein. For example only, the center frequency of the RF system 20 may be in a first frequency range and may be, for example, greater than 40 MHz. For example, the center frequency may be 60 MHz. Although described as being in the first frequency range, the center frequency may be at frequencies less than or equal to 40 MHz, such as at 27 MHz. The frequency of the input signal 30 may vary, for example, ±5-10%. The driver module 22 amplifies the input signal 30 to generate a low-powered RF signal (or an amplified output signal) 32.

The low-powered RF signal is received by each of the PA modules 24, 26. The PA modules 24, 26 convert the low-powered RF signal 32 (RF signals having power in a first range) to high-powered RF signals 34, 36 (having power in a second range higher than the first range). The power combiner 28 combines the high-powered RF signals 34, 36. An output of the power combiner 28 is provided to a load (e.g., a voltage standing wave ratio load) 40. The load 40 may be, for example, a plasma chamber. The combined power from the PA modules 24, 26 may drive the load 40 to fabricate various components such as integrated circuits, solar panels, compact disks (CDs), digital versatile (or video) discs (DVDs), and the like. The load 40 may include any of a number of elements or devices driven by a RF signal, including, by way of a non-limiting example, a plasma chamber. The load 40 may include broadband mismatched loads (i.e. cables with mismatched resistor terminations), narrowband mismatched loads (i.e. a 2-element matching network) and resonator loads. The load 40 may be an open circuit or a short circuit load. Different electrical phase lengths from the generator output may be associated with the load.

The driver module 22 includes a resistive network 50, a hybrid module 52, an attenuator 54, a preamplifier 56, a driver 58 and a splitter 60. The resistive network 50 may be a pie network including a variable resistance. The hybrid module 52 may include a hybrid amplifier with multiple stages of amplification. The hybrid module 52 may provide, for example, 35 dB of amplification. The attenuator 54 attenuates the output of the hybrid module 52 and may include an inductance-capacitance (LC) network tuned to an operating frequency of the RF amplifier system 20 to minimize gain variations over the AFT bandwidth. At 60 MHz, an LC network of the attenuator 54 provides a positive gain slope for frequency compensation of the PAs in the PA modules 24, 26. The preamplifier 56 may include a single ended transistor that amplifies an output of the attenuator 54. The driver 58 may include a push-pull power amplifier similar to one of the power amplifiers in the PA modules 24, 26.

The resistive network 50, the hybrid module 52, the attenuator 54 and the preamplifier 56 amplify a signal condition the input signal 30 to generate a conditioned signal 62. The conditioned signal 62 is provided to the driver 58. Output of the driver 58 is split via the splitter 60 (referred to as an isolated splitter) into multiple low-powered RF signals 64, 66, which are received by the PA modules 24, 26.

The RF amplifier system 20 may include any number of PA modules. The RF amplifier system 20 provides RF power based on received DC power. By way of a non-limiting example, each of the PA modules 24, 26 may provide a power output of greater than or equal to, for example, 2.5 kilowatts (kW). The RF amplifier system 20 may provide, for example, 3.5 kW of power. RF amplifier systems providing, for example, 5 kW and 10 kW of power are provided respectively in FIGS. 9 and 10. Outputs of the PA modules 24, 26 are received by the power combiner 28 and drive the load 40. The first PA module 24 may include a first splitter 68, a second splitter 70, a third splitter 72, three push-pull PAs (first set of PAs) 74, 76, 78 and a resistance 80. The second PA module 26 may include a first splitter 82, a second splitter 84, a third splitter 86, three push-pull PAs (second set of PAs) 88, 90, 92, and a resistance 94. The splitters 60, 68, 70, 72, 82, 84, 86 and other splitters disclosed herein may be of an isolated type and/or may each be Wilikinson power splitters. This prevents interaction between the PAs 74, 76, 78, 88, 90, 92.

The first splitters 68, 82 split the low-powered RF signals 64, 66. Outputs of the first splitters 68, 82 are provided to the second and third splitters 70, 72, 84, 86. Outputs of the second splitters 70, 84 are provided to respective ones of the PAs 74, 76, 88, 90. Outputs of the third splitters 72, 86 are provided to respective ones of the PAs 78, 92 and the resistances 80, 94. The resistances 80, 94 may be connected between the third splitters 72, 86 and a ground reference 100. The resistances 80, 94 may each have a resistance of, for example, 50 Ohms (Ω).

Outputs of the PAs 74, 76, 78 may be provided to an output module 101 and be galvanically and directly connected to each other without isolation. Outputs of the PAs 88, 90, 92 may be provided to an output module 102 and be galvanically and directly connected to each other without isolation. Example output modules are shown in FIGS. 7, 8, 15 and 17. Each of the output modules disclosed herein provides combining, impedance matching and frequency compensation. Operating efficiency (i.e. power out versus power in of the RF amplifier system 20) using the tri-PA configuration may be up to 80% because the load line is lower and hence closer to class E operation. An output LC transformation may not be used as the tri-PA configuration at 60 MHz provides a flat AFT response. This is because the load seen by each PA output is lower and hence the PA operates at the high efficiency end of the variable class range. An output LC transformation on each individual PA output could also be used but the result would not be as flat as this directly combined approach using transmission lines. For applications where the efficiency is too high and the plasma control loop response is inadequate a variable class module may be used.

Figure 9:
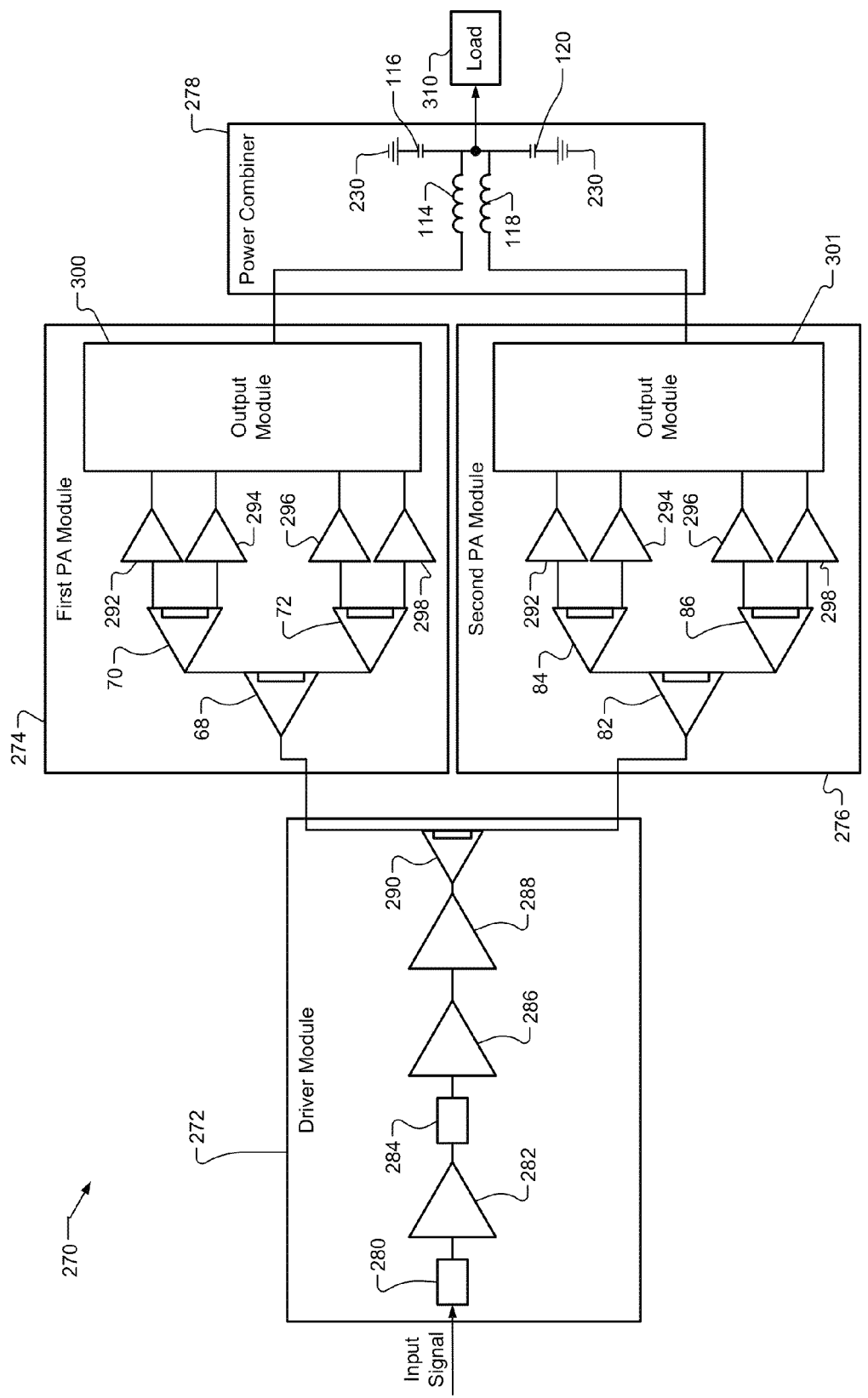
FIG. 9 is a block and schematic diagram of another radio frequency amplifier system with a quad-power amplifier configuration operating in the first frequency range and having a first power output rating in accordance with the present disclosure.

Although the RF amplifier system 20 is shown as having two PA modules, the RF amplifier system 20 may have any number of PA modules. Also, although each of the PA modules 24, 26 is shown as having three PAs, each of the PA modules 24, 26 may have any number of PAs. An example of a RF amplifier system with PA modules that each includes four PAs is shown in FIG. 9.

In order to provide a predetermined impedance at outputs of the output modules 101, 102, components within the PAs 74, 76, 78, 88, 90, 92 and/or connected between the power combiner 28 and the PAs 74, 76, 78, 88, 90, 92 may be changed when the number of PAs per PA module is changed. Also, the number of PAs per PA module and/or the number of PAs sharing a combined output terminal may be changed depending upon: the type and impedances of transistors in the PAs; the type and turns ratio of transformers in the PAs; and/or impedances of transmission lines between the PAs 74, 76, 78, 88, 90, 92 and the outputs of the output modules 101, 102.

The number of PAs may be adjusted to provide a different operating class. A first number of PAs may provide an amplifier system that operates in a first class. A second number of PAs may provide an amplifier system that operates in a second class. As an example, at 60 MHz the PA class of operation may be varied by selecting a 3 PA configuration or a 4 PA configuration because this varies the load seen by each individual PA output. The number and arrangement of capacitances and inductances between (i) the PAs (e.g., the PAs 74, 76, 78, 88, 90, 92) and (ii) the power combiner 28 may also be altered. This is explained in more detail below.

The power combiner 28 includes a first branch 110 and a second branch 112. The first branch 110 includes a first inductance 114 and a first capacitance 116. The second branch 112 includes a second inductance 118 and a second capacitance 120. The first inductance 114 and the first capacitance 116 are connected in series between the first output terminal 102 and the ground reference 100. The second inductance 118 and the second capacitance 120 are connected in series between the second output terminal 104 and the ground reference 100. A third output terminal 122 is connected: between the first inductance 114 and the first capacitance 116; between the second inductance 118 and the second capacitance 120; and to the load 40. The power combiner 28 may be a non-isolated combiner. As a non-isolated combiner, the power combiner 28 does not include a resistance between the output modules 101, 102 and the inductances 114, 118.

Figure 5:
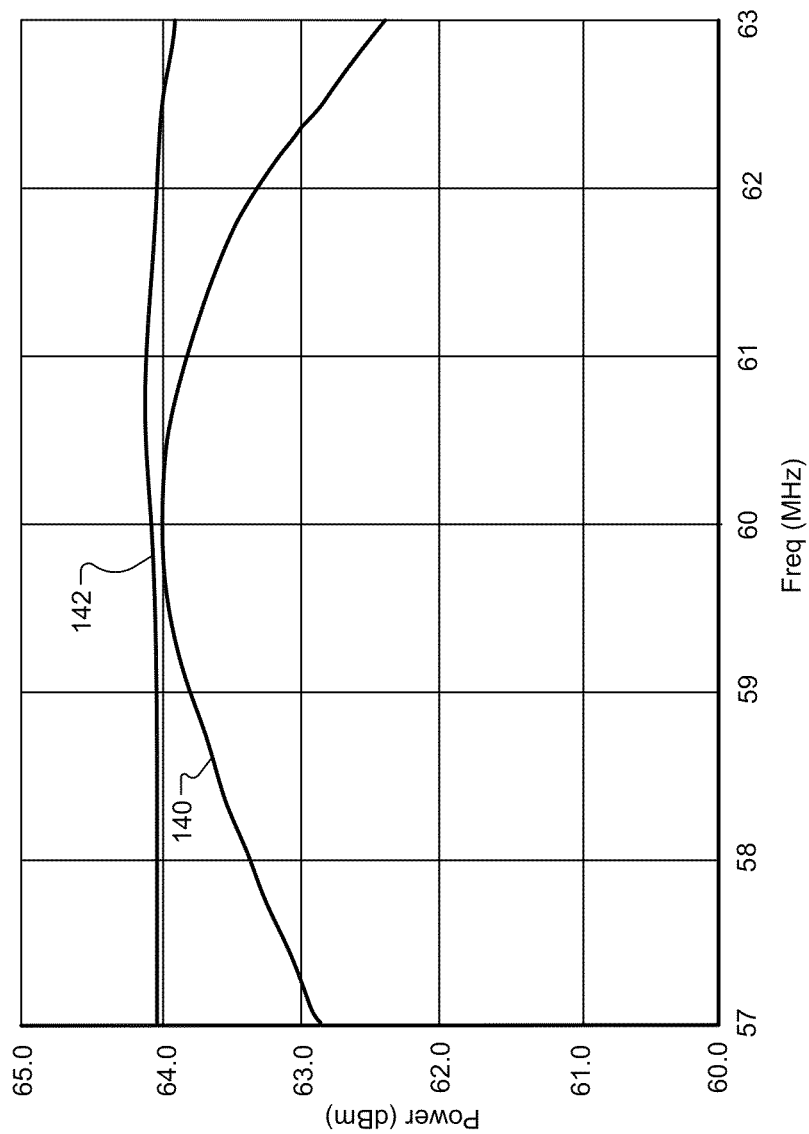
FIG. 5 is an example power versus frequency plot illustrating differences between the traditional variable class amplifier system and the radio frequency amplifier system of FIG. 4.

In FIG. 5, an example power versus frequency plot is shown for the traditional variable class amplifier system and the RF amplifier system 20 of FIG. 4. A first power versus frequency curve 140 is shown for the traditional variable class amplifier system. A second power versus frequency curve 142 is shown for the RF amplifier system 20. The first power versus frequency curve 140 illustrates a 46% (1.6 dB) variation in power output over a predetermined frequency range. The power output values of the curves 140, 142 are associated with the power output of a respective PA module. The second power versus frequency curve 142 illustrates less than 6% (0.25 dB) variation in power output over the same predetermined frequency range. Thus, the RF amplifier system 20 exhibits less variation in power output and efficiency than the traditional variable class amplifier system across an AFT frequency range. The efficiency is higher at lower frequencies than traditional variable class designs due to the load line and CLC impedance variation of the traditional designs. As a result, the RF amplifier system 20 has improved efficiency.

In addition to providing reduced variations in power output, the RF amplifier system 20 also provides reduced variations in supply current consumed by PAs. Continuing from the same example, the traditional variable class amplifier system may exhibit approximately a 16% variation in supply current, as shown in FIG. 2. The RF amplifier system 20 may exhibit when operating in the first frequency range less than approximately 7% variation.

Figure 6:
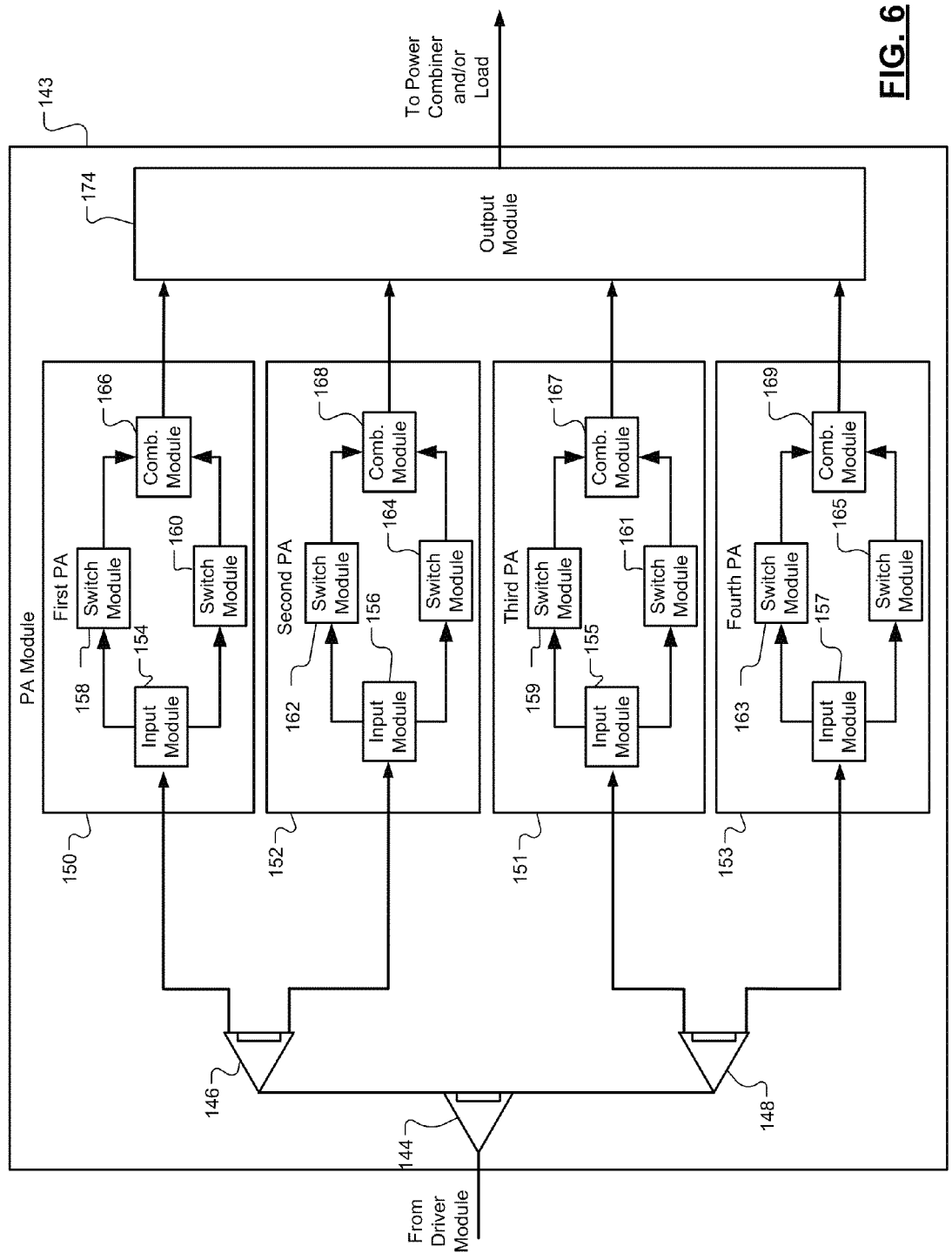
FIG. 6 is a block diagram of a power amplifier module in accordance with the present disclosure.

Referring now also to FIG. 6, a PA module 143 is shown. The PA module 143 may be used for various center frequencies (e.g., 27 MHz, 40 MHz and 60 MHz). The PA module 143 includes PAs 150-153. Although four PAs are shown in FIG. 6, any number of PAs may be included and the outputs of which are combined. The PAs 150-153 may be push-pull PAs. The PAs 150-53 include respective input modules 154-157 switch modules 158-165 and combination modules 166-169. The input modules 154-157 receive a respective low-powered RF input signals (e.g., the low-powered RF signal 32 of FIG. 4), which may be an oscillating signal that varies in frequency (e.g., ±5% from a center frequency) and/or phase. The low-powered RF input signals may be from splitters 144, 146, 148. The input modules 154-157 provide the low-powered RF input signals to each of the switch modules 158-165. The input modules 158-165 may provide impedance transformation between one of the splitters 146, 148 and the switch modules 158-165. Impedances of the input modules 154-157 may be set to provide impedance matching between a splitter (e.g., the splitter 60 of the driver module 22 of FIG. 4) and one or more splitter(s) (e.g., the splitters 146, 148). The input impedance of the PA module 143 may be, for example, 50Ω. The input modules 154-157 also provide a balanced drive (0°, 180°) and/or balanced signals to the switch modules 158-165. The power combiner 28 of FIG. 4 may combine amplified balanced signals to provide a single ended output.

The input modules 154-157 may also decrease input impedances at inputs of the switch modules 158-165 and dissipate and isolate reflected power received from the switch modules 158-165 and from the load. Although not shown in FIG. 6, shunt resistances and capacitances may be included between the input modules 154-157 and the switch modules 158-165 (see, for example, FIG. 15). This prevents interaction between the PAs as a result of reverse power from PA reverse isolation (S12), reaching each PA input, and causes instability and spurious outputs particularly at f/2 frequencies. The switch modules 158-165 receive respective output signals from the input modules 154-157 and generate amplified signals. The combination modules 166-169 combine the amplified signals and generate combined output signals, which may be provided to a power combiner and/or load.

Outputs of the combination modules 166-169 are provided to an output module 174. The output module 174 may provide impedance matching, as is further described below. The impedance matching is provided between the outputs of the combination modules 166-169 and the power combiner and/or load. Outputs of the PAs 150-153 may be galvanically and directly combined at an output terminal without isolation. The output terminal may be connected to the power combiner and/or load.

Each of the input modules 154-157 may include a capacitance and/or a transformer as disclosed below. Each of the switch modules 158-165 may include capacitances and switches, as disclosed below. Each of the combination modules 166-169 may include a transformer (e.g., a Balun transformer) as disclosed below. The output module 174 may include PA output transmission lines and shunt capacitance(s) as disclosed below.

Figure 7:
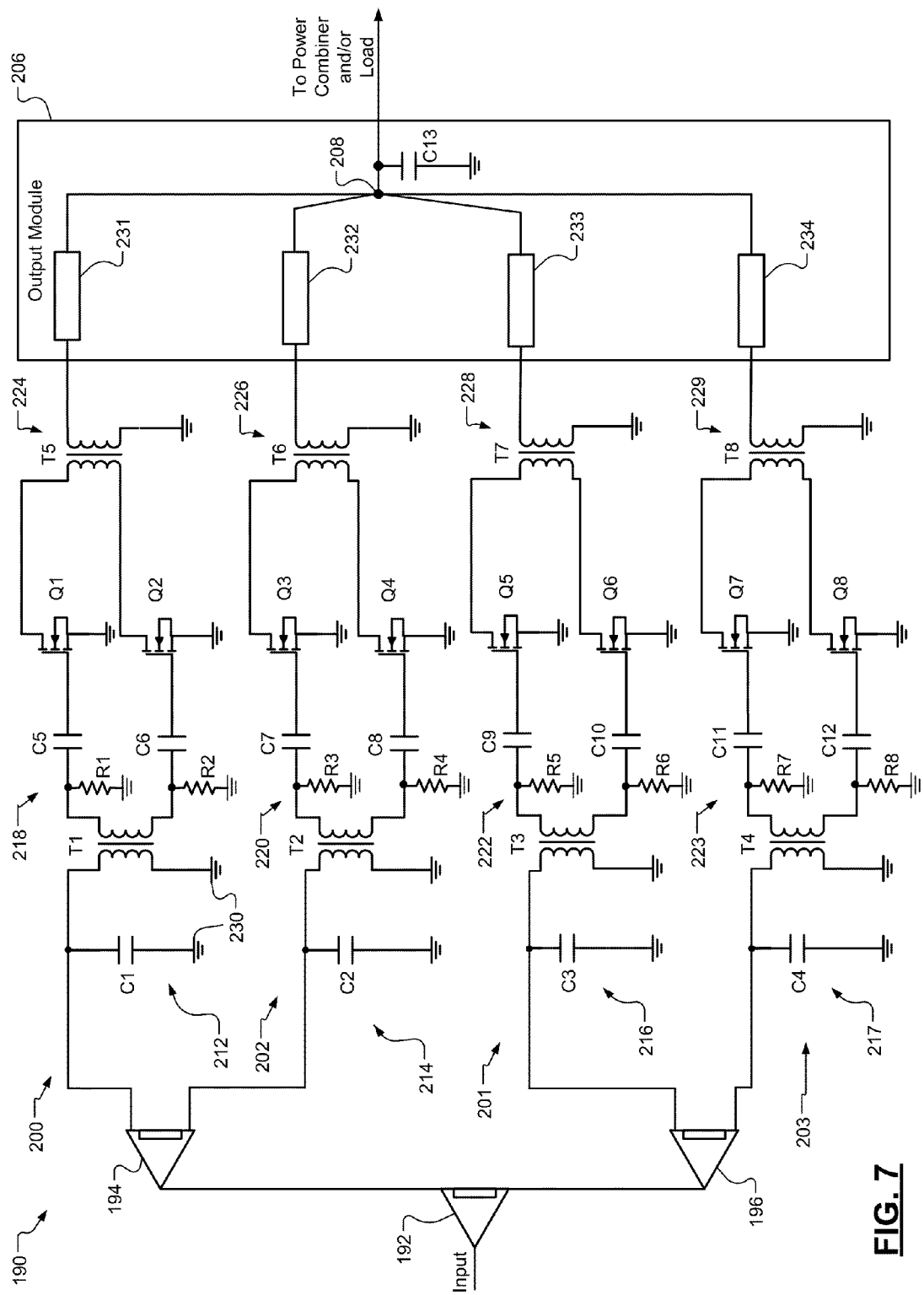
FIG. 7 is a schematic diagram of a power amplifier module in accordance with the present disclosure.
Figure 15:
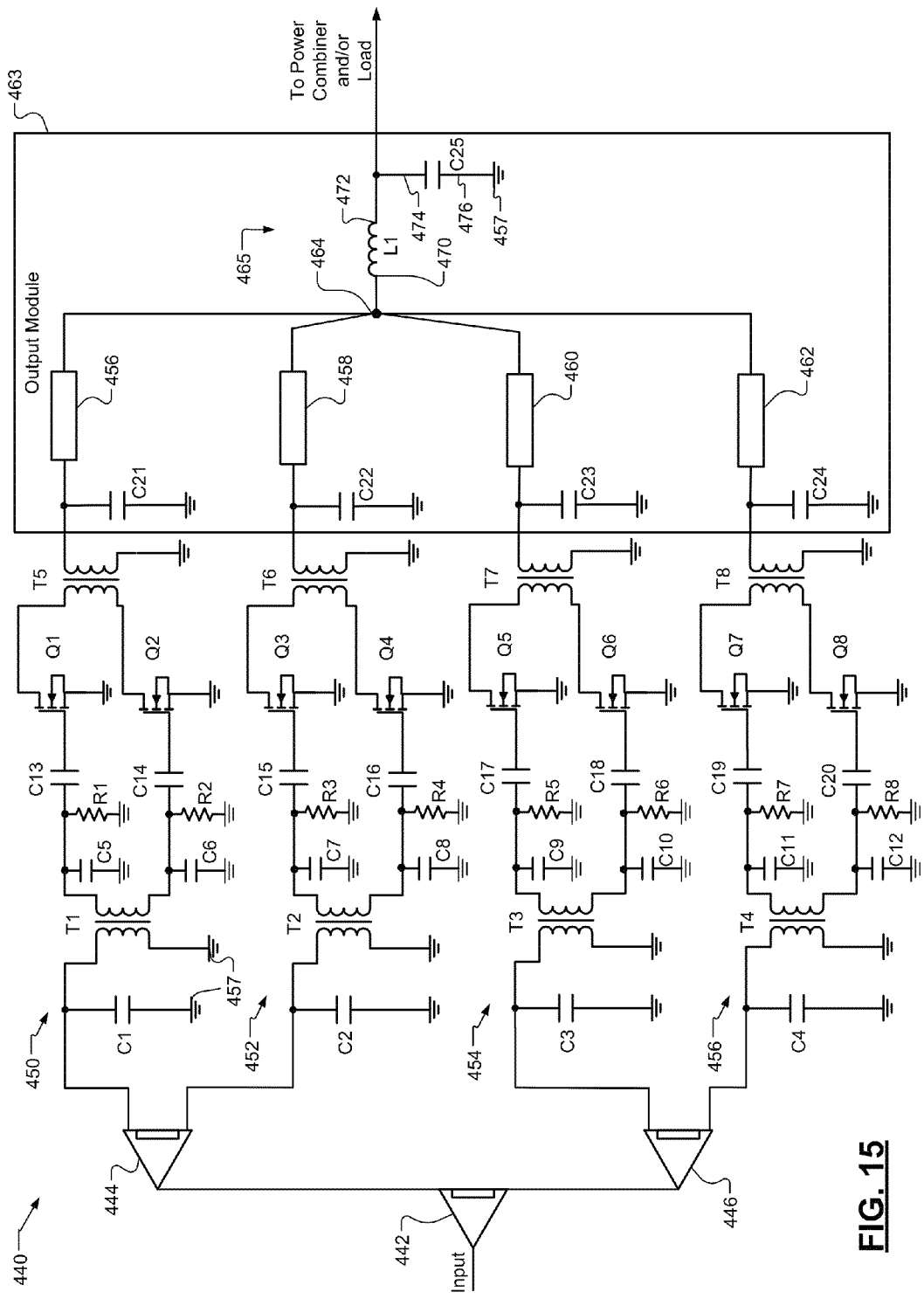
FIG. 15 is a schematic diagram of a power amplifier module with an output impedance matching operating in a second frequency range in accordance with the present disclosure.

In FIG. 7, a PA module 190 is shown. The PA module may be used for various center frequencies (e.g., 60 MHz) and includes splitters 192, 194, 196, PAs 200-203 and an output module 206. Although 4 PAs are shown and the outputs of which are combined by an output module, any number of PAs may be incorporated and the outputs of which combined. The PAs 200-203 include respective input modules 212-217, switch modules 218-223 and combination modules 224-229. Each of the input modules 212-217 may include a respective first capacitance C1, C2, C3, C4 and input transformer T1, T2, T3, T4 (e.g., a binocular input transformer). In one implementation (e.g., operating at center frequencies other than 60 MHz, such as at 27 MHz or 40 MHz), the first capacitances C1-C4 are not included. Shunt resistances R1-R8 are included on respective outputs of the input transformers T1-T4. In another implementation (e.g., operating at center frequencies other than 60 MHz, such as at 27 MHz or 40 MHz), shunt capacitances as shown in FIG. 15 are included on the respective outputs of the input transformers T1-T4. The shunt resistances R1-R8 and shunt capacitances on the respective outputs of the input transformers T1-T4 provide impedance transformation and isolation between transistors in each of the PAs 200-203, which prevents f/2 spurious peaks.

The first capacitances C1-C4 and the input transformers T1-T4 receive low-powered RF signals from the splitters 194, 196. First ends of the first capacitances C1-C4 are connected to first ends of primary input windings of the input transformers T1-T4. Second ends of the first capacitances C1-C4 are connected to a ground reference 230. Second ends of the primary input windings are connected to the ground reference 230.

Each output of secondary output windings of the input transformers T1-T4 are connected to one of the switch modules 218-223. Each of the switch modules 218-223 includes respective ones of second capacitances C5, C7, C9, C11, first transistors Q1, Q3, Q5, Q7, third capacitances C6, C8, C10, C12, and second transistors Q2, Q4, Q6, Q8. The secondary output windings are connected between the second capacitances C5, C7, C9, C11 and third capacitance C6, C8, C10, C12. The transistors Q1-Q8 include control terminals (or gates), drains, and source. The transistors Q1-Q8 may be, for example, metal-oxide-semiconductor field-effect transistors (MOSFETs). Each of the control terminals is connected to a respective one of the second and third capacitances C5-C12. The drains are connected to the combination modules 224-229. The sources are connected to the ground reference 230.

The combination modules 224-229 each include a respective one of the output transformers T5-T8, which may be Balun transformers. In the quad-PA configuration shown, the winding ratio of the output transformers T5-T8 may be, for example, 4:1. As another example, in a tri-PA configuration, the winding ratio of corresponding output transformers may be 3:1.

The drains of the transistors Q1-Q8 in each of the PAs 200-203 are connected to terminals of a primary input winding of one of the output transformers T5-T8. Each secondary output winding of the output transformers T5-T8 includes a first terminal and a second terminal. The first terminals of the secondary output windings are connected to the output module 206. The second terminals of the secondary output windings are connected to the ground reference 230.

The outputs of the PAs 200-203 are directly connected to a respective output terminal 208. Output impedances measured at outputs of transmission lines 231-234 associated with the PAs 200-203 may be, for example, 108-j95Ω. The transmission lines 231-234 may refer to conductive lines or traces between the outputs of the PAs 200-203 and the output terminal 208. As a result, impedance of the output terminal 208 is 50 Ohms due to the parallel connection of the outputs of the PAs 200-203, the impedances of the transmission lines 231-234, and the impedance of the shunt capacitance C13.

The output module 206 provides the correct PA output load line impedances as well as impedance compensation over frequency, thus minimizing variation in output power, power supply current consumed, and gains of the PAs 200-203 over the AFT bandwidth. The disclosed network minimizes loses, which increases the overall efficiencies of the PAs 200-203. CLC impedance matching networks are not included, which minimizes output power variation with frequency. The output module 206 compensates for these impedance changes to minimize frequency variations in the output power levels, supply current consumed, and gains of the PAs 200-203. As an example, at 60 MHz, the frequency impedance compensation is low. This aids in maintaining the output power levels, supply current consumed, and gains of the PAs 200-203 at constant levels over the AFT bandwidth, which increases efficiencies of the PAs 200-203.

The output module 206 may include a shunt capacitance (designated C13) and respective transmission lines or traces (e.g., the transmission lines 231-234 for each of the PAs 200-203). As an alternative, the output module 206 may include the shunt capacitance C13 and a single transmission line, which is shared by the PAs 200-203. In this alternative implementation, outputs of the PAs 200-203 are directly and galvanically connected to each other prior to the output module 206.

Additional shunt capacitances may be included for fine tuning of PA load lines and/or a PA module load line. See, for example, the RF power amplifier system shown in FIG. 15. The additional capacitances in the output module of FIG. 15 may be used, for example, the 27 MHz and 40 MHz center frequency implementations and provide the correct load line, frequency impedance compensation and combining. Values of C21-25 may be minimal and/or zero for the 40 MHz center frequency implementation. The transmission lines 231-234 may each have an associated inductance and/or resistance. The transmission lines 231-234 may be grounded via printed circuit board (PCB) transmission line tracks. In one implementation, the transmission lines 231-234 are traces on a PCB. Output ends of the transmission lines 231-234 are galvanically connected to each other at the output terminal 208 without isolation. Power is provided from the output terminal 208 to a power combiner and/or load.

Figure 8:
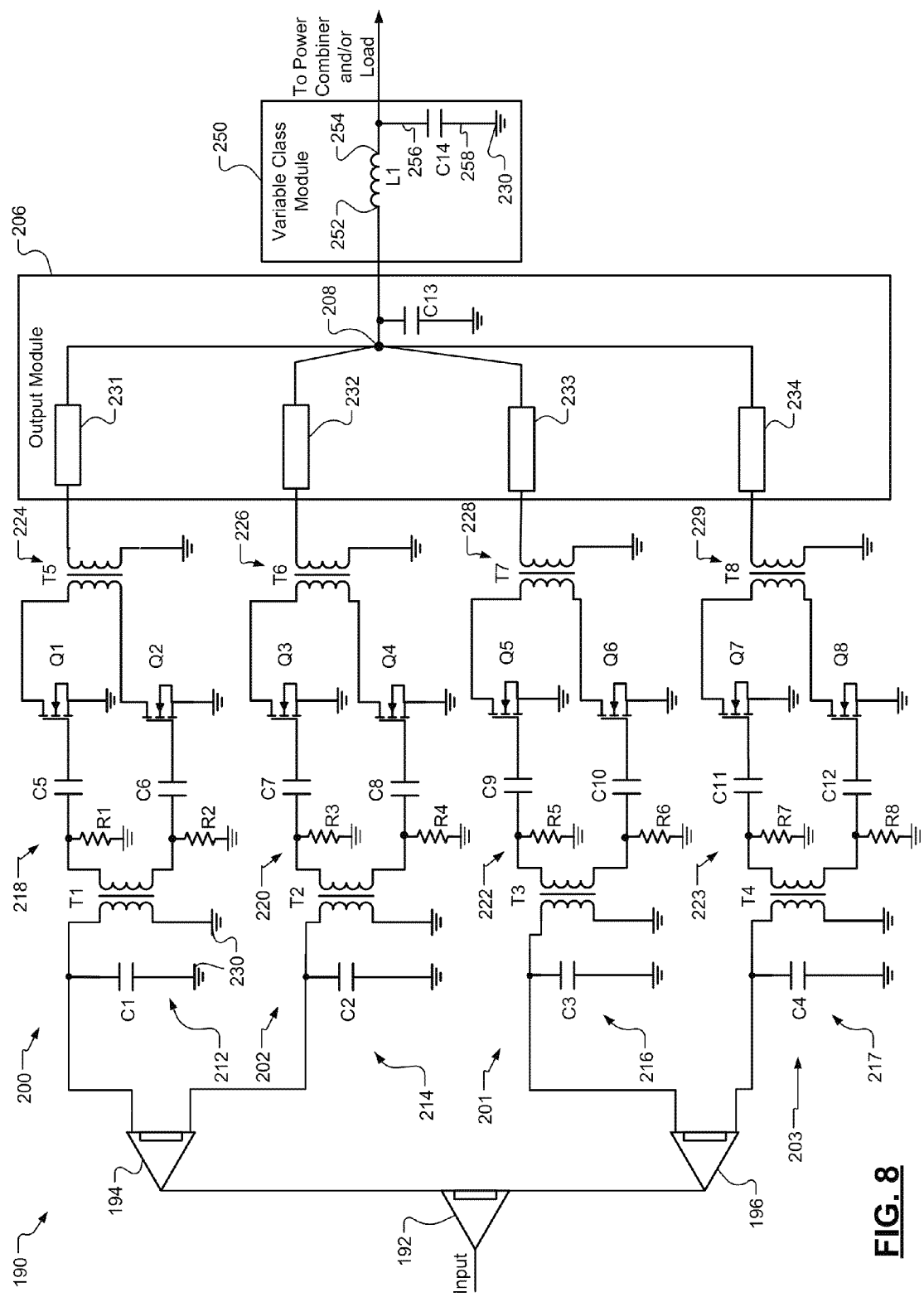
FIG. 8 is a schematic diagram illustrating a power amplifier module and a variable class module in accordance with the present disclosure.

In FIG. 8, the PA module 190 is shown. The PA module includes the splitters 192, 194, 196, the PAs 200, 201, 202, 203 and the output module 206. The outputs of the PAs 200-203 are provided to the output module 206. An output of the output module 206 is provided to a variable class module 250, which works by transforming the 50 Ohms load impedance to a lower impedance, moving the class of operation closer to Class E and increases efficiency. The PAs 200-203 may include the capacitances C1-C12, the resistances R1-R8, the transformers T1-T8, and the transistors Q1-Q8. In one frequency implementation (e.g., 40 MHz), the first capacitances C1-C4 are not included. In another frequency implementations (e.g., 27 MHz and 40 MHz), shunt capacitances as shown in FIG. 15 are included at outputs of the input transformers T1-T4. The shunt resistances R1-R8 provide a real impedance load and together with the series capacitors C5-C12 provide isolation between the pairs of transistors in each of the push-pull PAs 200-203, which prevents spurious outputs, especially at frequencies near f/2. This additional isolation is helpful because of the limited transistor reverse isolation (S12), mainly caused by Cgd. Although some of the alphanumeric references of the circuit elements of FIG. 8 match the alphanumeric references of circuit elements in other RF amplifier systems disclosed herein, the impedances of circuit elements having the same alphanumeric references may be different.

The output module 206 includes the transmission lines 231-234 and the shunt capacitance C13. The variable class module 250 is connected to the output of the output module 206 or the output terminal 208. The output module 206 and the variable class module 250 provide an output network.

The variable class module 250 allows the PAs 200-203 and the corresponding RF amplifier system to vary between different class operating modes (e.g., Class AB-Class E modes) simultaneously and/or during the same time period. The variable class module 250 would be included if higher efficiency is required at the expense of some AFT power flatness, and also provided that the frequency rating of the transistors is not already limiting AFT power flatness. The variable class module 250 allows the PAs 200-203 collectively to operate as a Class O amplifier, which works by transforming the 50 Ohms load impedance to a lower impedance, and together with the output transformers leakage inductance, moves the class of operation of the PAs closer to Class E and improves efficiency. Transforming the impedance to a lower impedance back to 50 Ohms moves the class operation back to lower efficiency class AB. The variable class module 250 allows real and imaginary impedances at each output of each of the PAs 200-203 and/or of the output module 206 to be adjusted at the same time.

The variable class module 250 includes a first inductance L1 and a shunt capacitance C14. The first inductance L1 includes a first end 252 and a second end 254. The shunt capacitance C14 includes a first end 256 and a second end 258. The first end 252 is connected to the output of the output modules 206 and/or the outputs of the transmission lines 231-234 at the output terminal 208. The second end 254 is connected to the first end 256. The second end 258 is connected to the ground reference 230. The second end 254 and the first end 256 are connected to a power combiner and/or load.

The value of the shunt capacitance C13, the first inductance L1, and/or the shunt capacitance C14 may be varied to change the class operating mode of a corresponding RF amplifier system that includes the PAs 200-203. As an example, by varying the shunt capacitance C13 and the shunt capacitance C14, the RF amplifier system may operate in the Class AB mode, the Class E mode, and/or any selected class mode between Class AB and Class E. Operation of the RF amplifier system may be tuned to the Class E mode, for example, by increasing the shunt capacitance C14 or to the Class AB mode by decreasing the shunt capacitance C14.

In FIG. 9, another RF amplifier system 270 with a quad-PA configuration operating in the first frequency range and having a first power output rating (e.g., 5 kilo-watts (kW), 2.5 KW per PA module) is shown. The RF amplifier system 270 includes a driver module 272, a first PA module 274, a second PA module 276, and the power combiner 278. The driver module 272 includes a resistive network 280, a hybrid module 282, an attenuator 284, a preamplifier 286, a driver 288, and a splitter 290, which may be similar to the resistive network 50, hybrid module 52, attenuator 54, preamplifier 56, driver 58, and splitter 60 of FIG. 4. The splitter 290 may be isolated from the splitters 68, 82. The PA modules 274, 276 are similar to the PA modules 24, 26, but each include four PAs 292, 294, 296, 298 (or set of PAs) and do not include the resistances 80, 94. The PA modules include the splitters 68-72 and 82-86.

Figure 17:
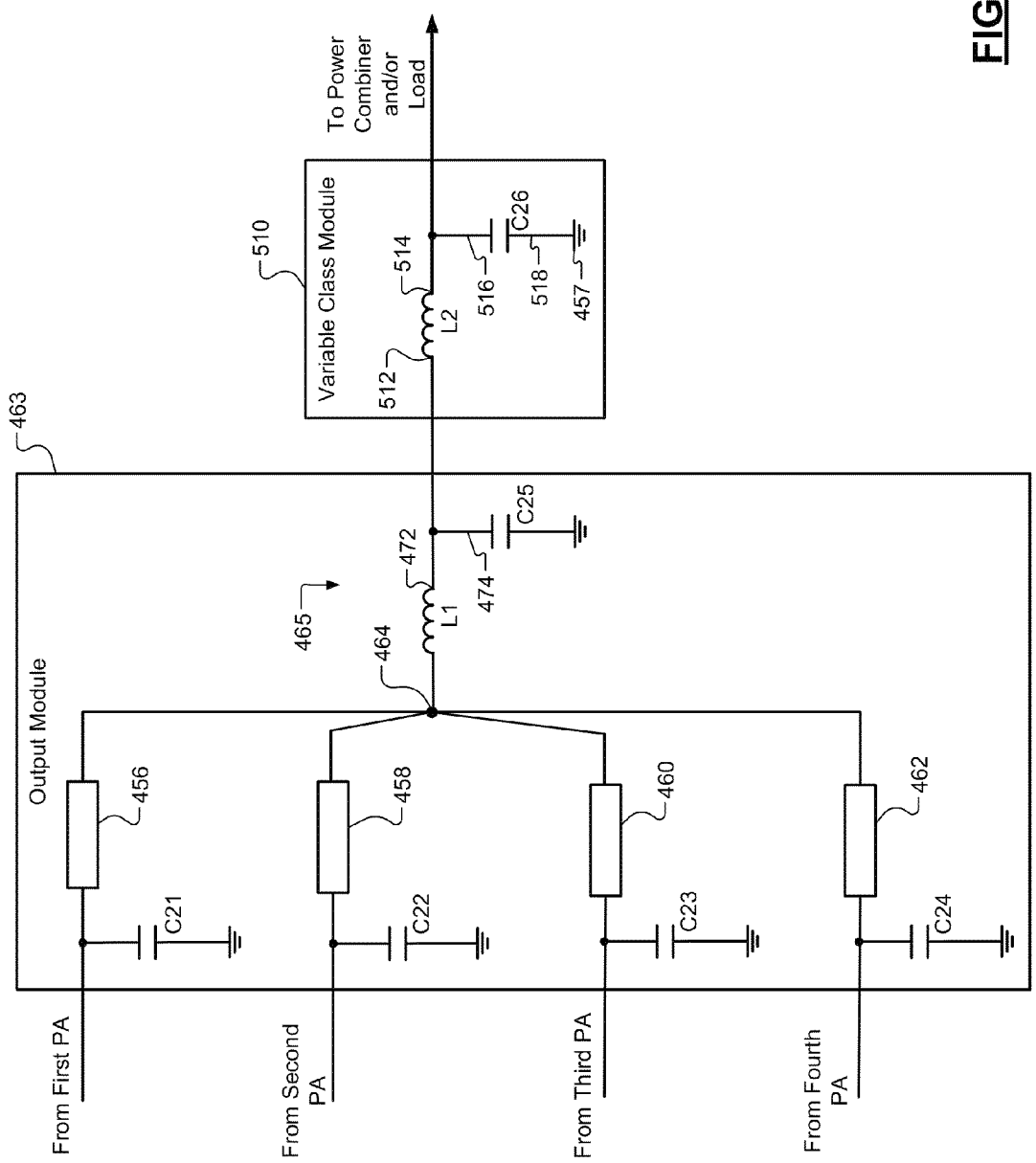
FIG. 17 is a schematic diagram of an output module with output impedance matching of FIG. 15 and a variable class module operating in the second frequency range in accordance with the present disclosure.

Each of the PAs 274, 276 includes a second transformer (similar to the second transformer T2 of FIGS. 7 and 8) with a 4:1 turns ratio. The turns ratio is 4:1 due to the incorporation of four PAs, to provide impedance matching, and to satisfy power output requirements. A 3:1 ratio may be used for the 4 PA implementation at, for example, 60 MHz. This results in the 4 PAs having close to class AB operation. At for example 27 MHz and 40 MHz, the 4 PAs may have transformers with the 4:1 ratio to provide a predetermined load line and to allow LC frequency compensation to provide impedance correction. Operating efficiency using the quad-PA configuration may be up to, for example, 73%. Examples of the PAs 274, 276 are shown in FIGS. 15 and 17. The first and second PAs 292, 294 receive outputs from the second splitters 70, 84. The third and fourth PAs 296, 298 receive outputs of the third splitters 72, 86.

Outputs of the PAs 292-298 may be galvanically and directly connected at respective output terminals without isolation via the output modules 300, 301. An output impedance measured at an output of each transmission line of the PAs 292-298 may be, for example, 100-j66Ω. As a result, impedance at each output terminal is 50Ω due to the parallel connection of the outputs of the PAs 292-298. Although the lengths of the transmission lines and/or the lines between the PAs 292-298 and the inductances 114, 118 may have the same length and/or may be symmetrical to provide RF electrical path lengths having the same impedance. This symmetry may be provided by any of the RF amplifier systems disclosed herein.

The power combiner 278 includes the inductances 114, 118 and the capacitances 116, 120. First ends of the inductances 114, 118 are each connected to a respective one of the output terminals of the output modules 300, 301. Output of the power combiner 278 as taken from the second ends of the inductances is provided to a load 310.

Figure 10:
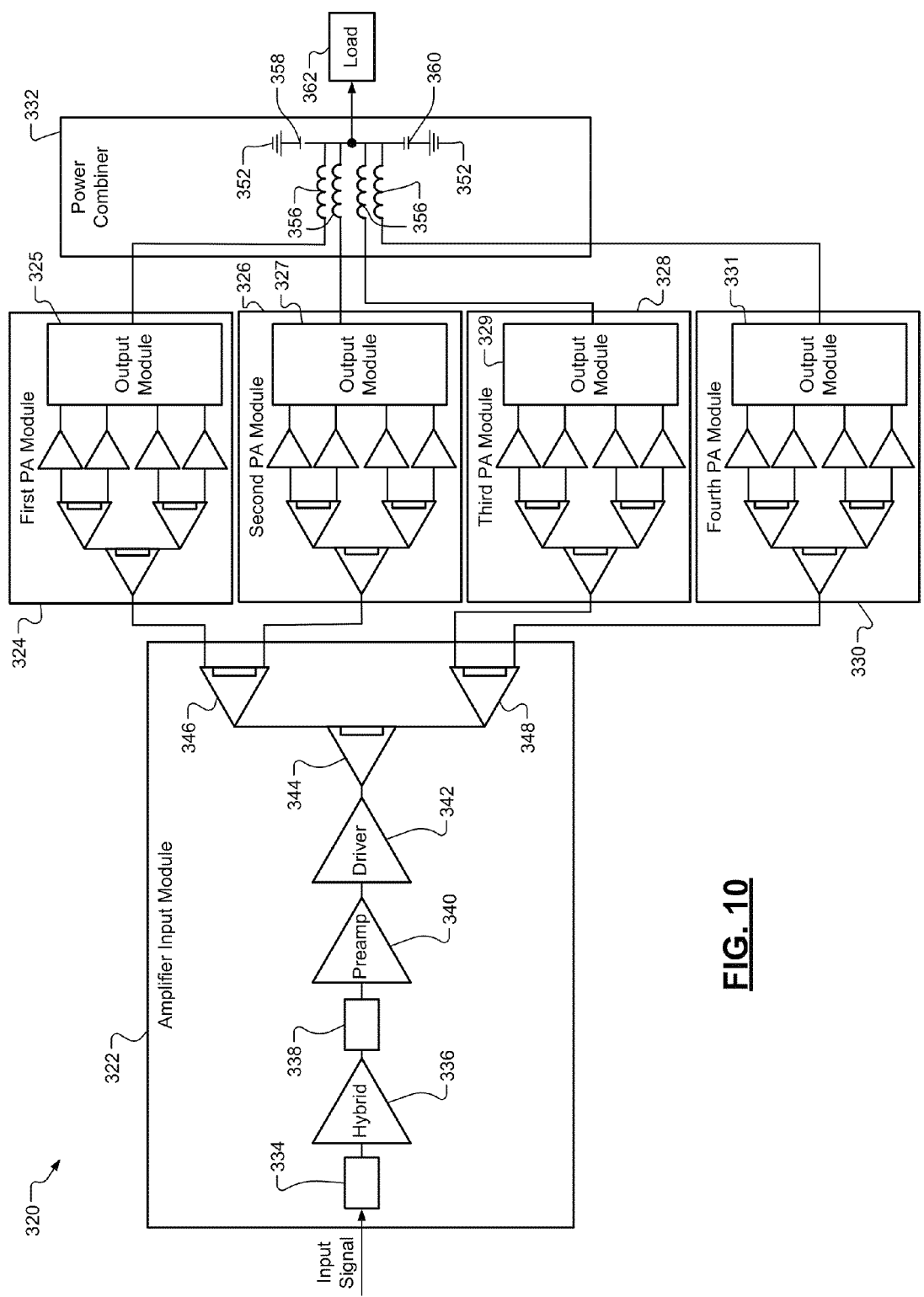
FIG. 10 is a block and schematic diagram of another radio frequency amplifier system for a second power output rating in accordance with the present disclosure.

In FIG. 10, another RF amplifier system 320 for a second power output rating (e.g., 10 kilo-watts (kW), 2.5 KW per PA module) is shown. The RF amplifier system 320 includes a driver module 322, PA modules 324, 326, 328, 330 with respective output modules 325, 327, 329, 331 and a power combiner 332. The RF amplifier system 320 may be used for 27 MHz, 40 Mhz, 60 MHz and/or other center frequency implementations. The driver module 320 includes a resistive network 334, a hybrid module 336, an attenuator 338, a preamplifier 340, a driver 342, and a first splitter 344, which may be similar to the resistive network 280, hybrid module 282, attenuator 284, preamplifier 286, driver 288, and splitter 290 of FIG. 9. The attenuator 338 may include an LC network for LC frequency compensation.

The driver module also includes a second splitter 346 and a third splitter 348. The splitters 346, 348 split respective output signals of the first splitter 344. Each of the output signals of the splitters 346, 348 is provided to a respective one of the PA modules 324-330. The splitters 344, 346, 348 may be Wilkinson type splitters. The splitters 344, 346, 348 and other splitters disclosed herein are isolated splitters to provide stability and minimize spurs.

The power combiner 332 includes inductances 356, which are each connected to a respective one of the output terminals 351. The power combiner 332 may also include capacitances 358, 360 connected between the inductances 356 and the ground reference 352. An output of the power combiner may be provided to a load 362.

Figure 11:
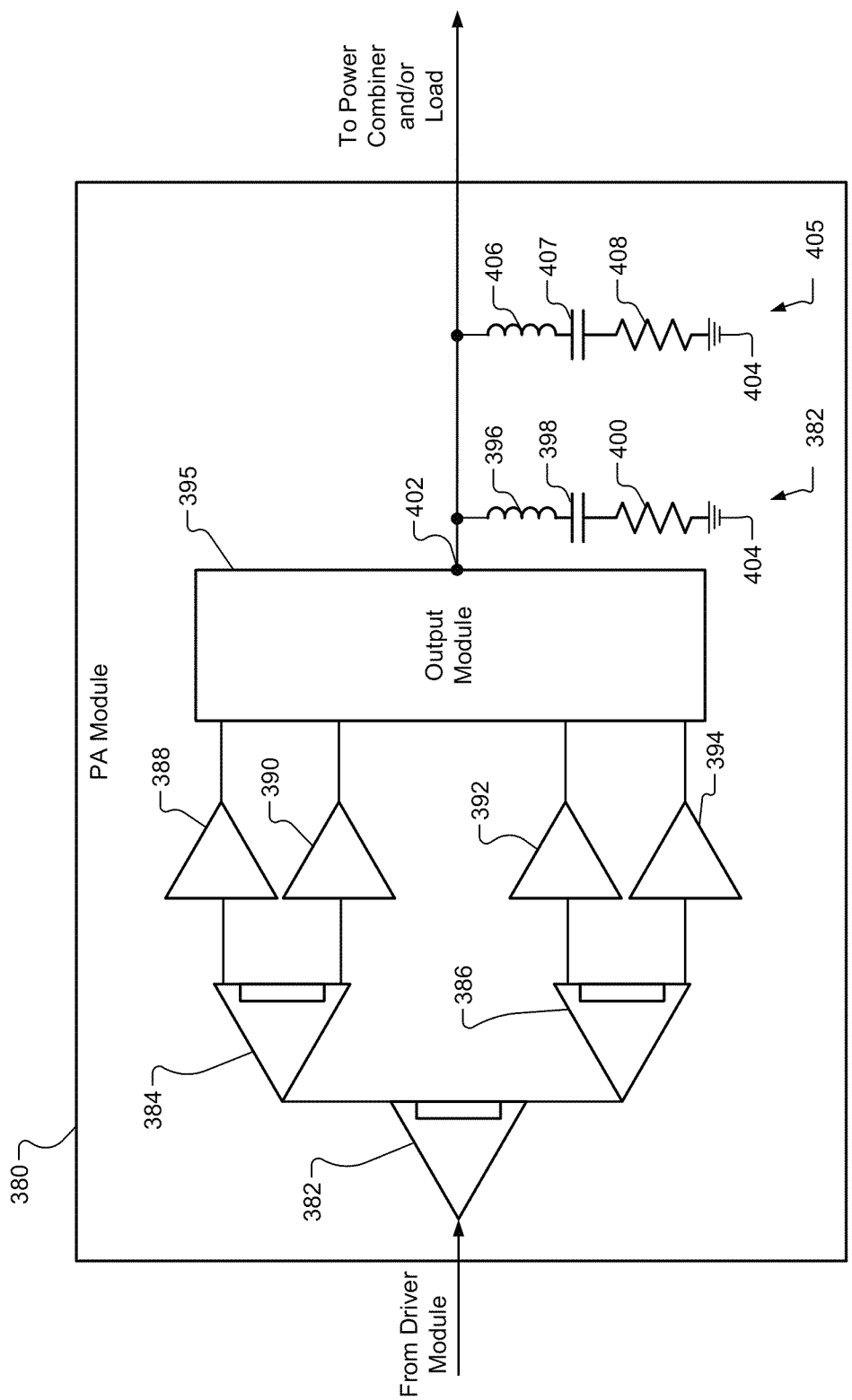
FIG. 11 is a block diagram of a power amplifier module including a harmonic attenuator circuit in accordance with the present disclosure.

In FIG. 11, a PA module 380 including a harmonic attenuator circuit 382 is shown. The PA module 380 may replace one of the PA modules in the RF amplifier systems of FIGS. 9 and 10. The PA module 380 includes splitters 382-386, PAs 388-394 and an output module 395. The PA module 380 also includes the harmonic attenuator circuit 382, which may include an inductance 396, a capacitance 398 and a resistance 400. The inductance 396, the capacitance 398 and the resistance 400 are connected in series and between an output terminal 402 and a ground reference 404. The harmonic attenuator circuit 382 attenuates second harmonics associated with a RF amplifier system (e.g., one of the RF amplifier systems 270, 320). As the RF amplifier system may be operable with a wide bandwidth (e.g., operates with an input signal having a frequency that varies ±5% from a center frequency), second harmonics may be generated. The harmonic attenuator circuit 382 attenuates these harmonics.

The PA module 380 may include a second harmonic attenuator circuit (or second harmonic trap) 405 to attenuate additional harmonics, such as third harmonics. The second harmonic trap may include an inductance 406, a capacitance 407 and a resistance 408, with different tuning values than the inductance 396, the capacitance 398 and the resistance 400. The second harmonic trap may be connected in parallel with the first trap.

Figure 12:
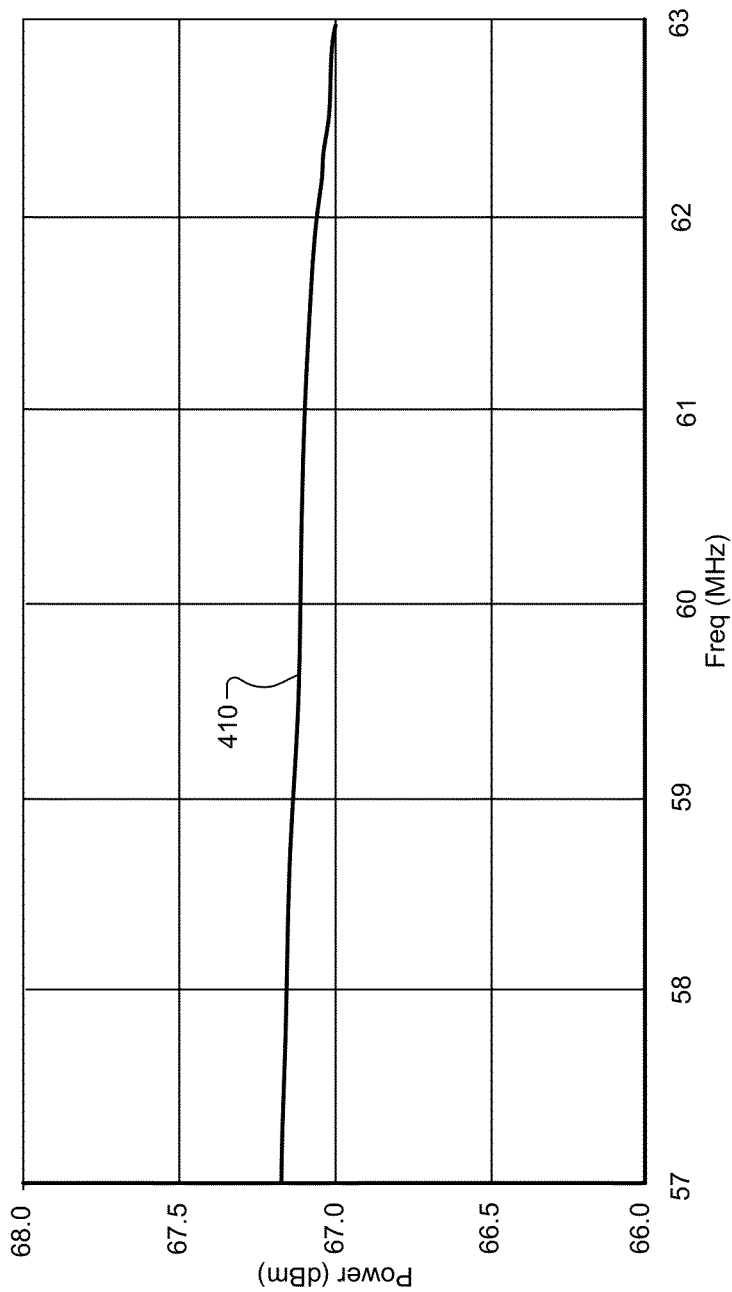
FIG. 12 is an example power versus frequency plot for the radio frequency amplifier system of FIG. 9.

In FIG. 12, an example power versus frequency plot for the RF amplifier system 270 of FIG. 9 is shown. A power output curve 410 is shown varying approximately 0.2 dB (or less than 4.7%) over a frequency operating range of 57-63 MHz. This is substantially less variance than the traditional variable class amplifier system. As a result, the RF amplifier system 270 exhibits improved operating power efficiencies at the lower frequencies of the associated AFT range. Also, by simplifying the output networks and reducing the number of components used, power dissipation and component losses are further reduced. RF power supplied to a load is flat (unchanged) and power supply current variations are minimal with changes in frequency.

Figure 13:
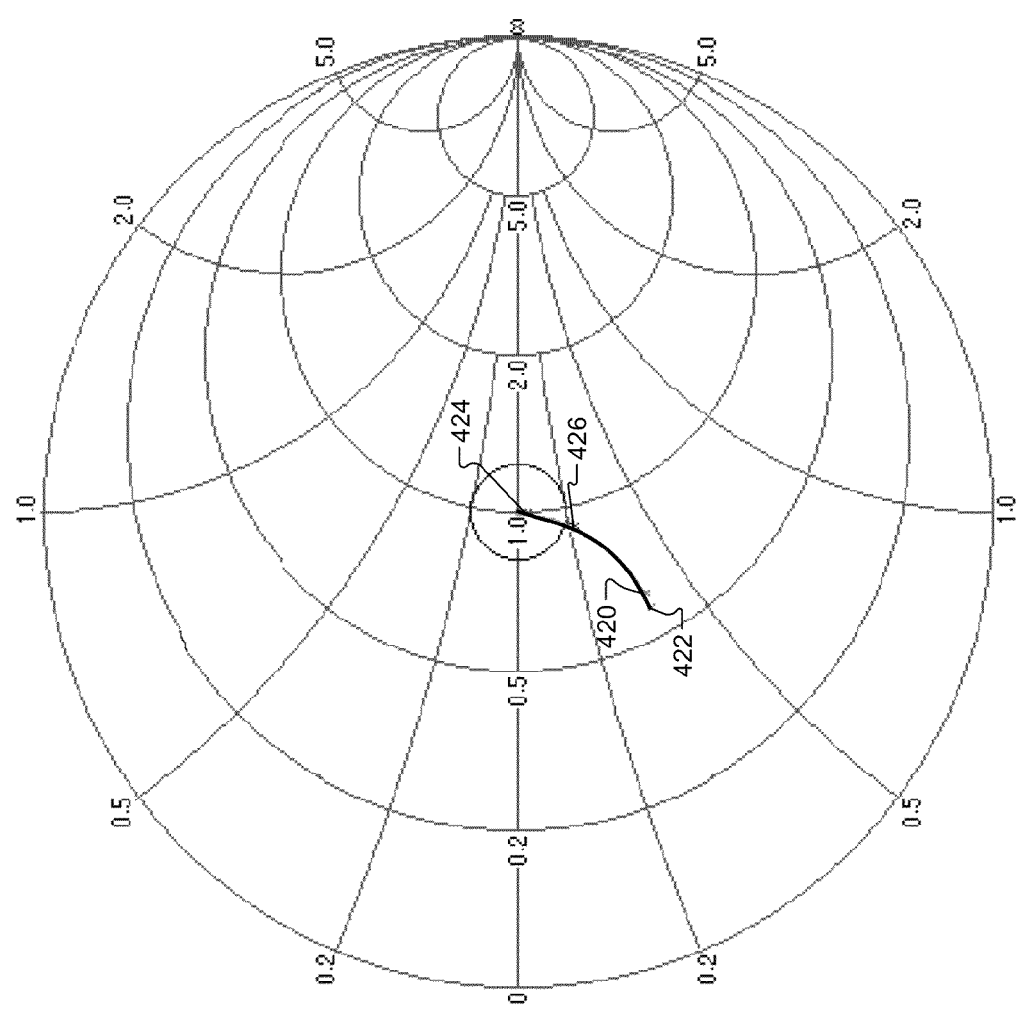
FIG. 13 is a Smith chart illustrating example impedances for an output of a PA module of the radio frequency amplifier system of FIG. 9 operating in the first frequency range.

In FIG. 13, a Smith chart illustrating example impedances for an output of a PA module of the RF amplifier system 270 of FIG. 9 is shown. Output network impedance variation over an AFT range is minimal. Two normalized impedance points 420, 422 are shown for 57 MHz and 63 MHz. The two normalized impedance points 420, 422 are output impedances as a result of impedance matching disclosed herein. Impedances at an output of the PA module, not including the impedance matching, are shown by points 424, 426. The impedance is 50 Ohms for 57 MHz and 63 MHz at the load and gets transformed to the impedances 420 and 422 at the other end of the track. These are the impedances that the four transformers would see if they were joined together and connected to that end of the single transmission line. Each individual PA transformer output would see a different impedance which is generally higher. Each PA may see an impedance of, for example, 47-j10 Ω, where 47 is the real impedance portion and 10 is the imaginary impedance portion. Four 200 Ohm PA impedances in parallel results in 50 Ohms when the Pas are directly combined at an output connector point. The impedance at the other end of this track, which is also the impedance seen by each PA output may be, for example, 108-j95 Ohms. For the three PA case, the impedance seen by each PA output may be, for example, 100-j66 Ohms.

Dividing the real and imaginary impedance portions by 200 provides the impedance points shown in the Smith chart. As a result, the real impedance of the outputs of the second transformers of the PA module may vary 8.56 Ω or approximately 7% over the frequency operating range with the use of the impedance matching. The real impedance may be adjusted using the impedance matching to provide a predetermined impedance for each of the PAs and combined with outputs of other PAs to provide a combined nominal impedance of, for example, 50 Ω at an output terminal (e.g., the output terminal 464 of FIG. 15). See other example real and imaginary impedance values stated above for 3 PA and 4 PA examples.

Figure 14:
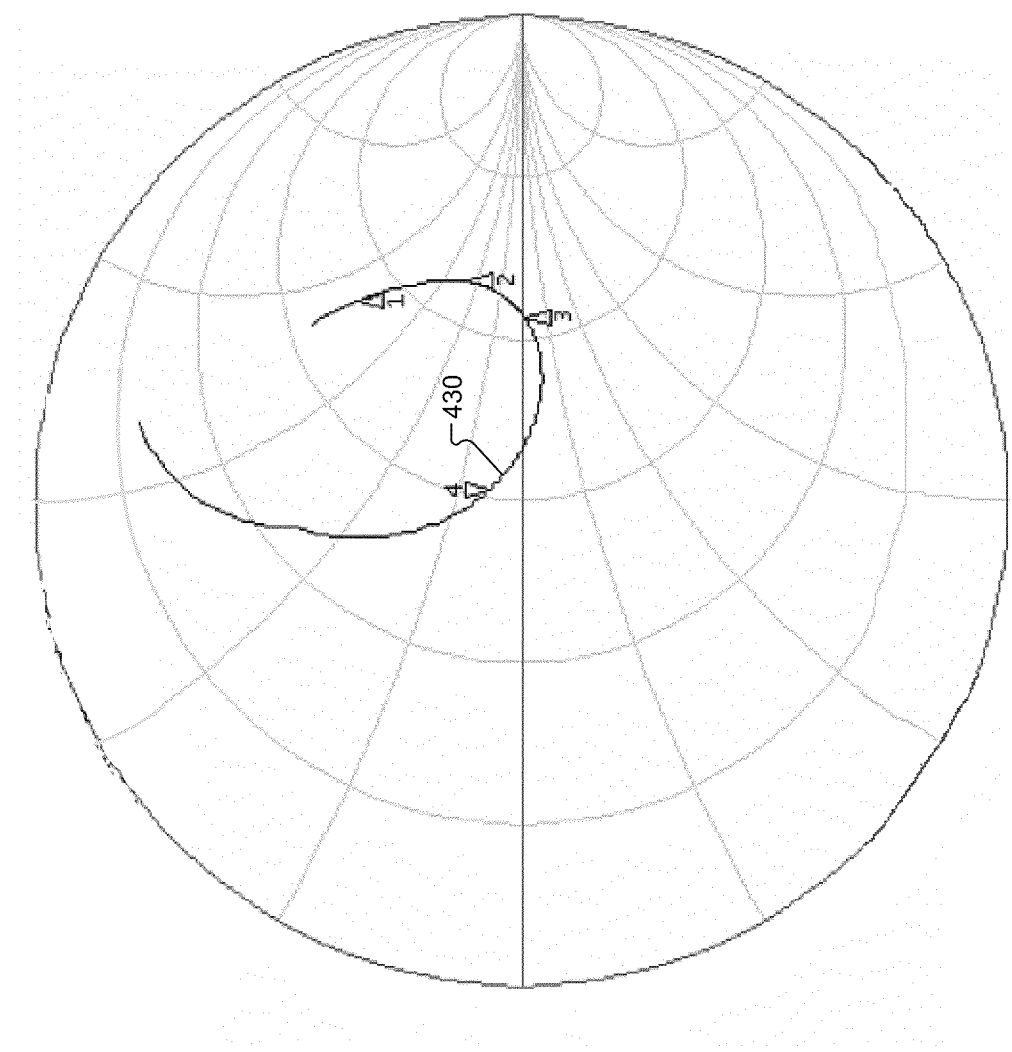
FIG. 14 is a Smith chart illustrating example impedance variation of transistors and a transformer of a power amplifier operating at different frequencies.

In FIG. 14, a Smith chart illustrating example impedances of transistors and a transformer (e.g., two of the transistors Q1-Q8 and a corresponding one of the transformers T5-T8 of FIGS. 7, 8) and/or impedances as measured at a secondary coil of the transformer operating at different frequencies is shown. The frequencies (e.g., 13 MHz, 27 MHz, 40 MHz, 60 MHz) may refer to frequencies of signals received by a PA and having a frequency variation of ±5%. FIG. 14 shows an amount of variation of output impedance variation at the output transformer secondary. One reason why there is differences in output modules for different operating frequencies is due to this output binocular output transformer impedance variation over frequency. The output modules are different in both impedance transformation for a given load line and the amount of frequency impedance compensation. This variation is the output transformer variation because a fixed parallel RC is connected to the transformer primary.

An impedance curve 430 is shown for combined impedances of transistors and a transformer for different frequencies. On the impedance curve 430 four impedance points 1-4 are shown respectively for 13.0 MHz, 27.0 MHz, 40 MHz, and 60 MHz. Each of these points 1-4 may refer to a center frequency of an input signal supplied to a RF amplifier system and/or to a PA of the RF amplifier system. As an example, real combined impedances of the transistors and transformer may vary by a predetermined amount over the four operating frequencies associated with the four impedance points 1-4.

These impedance variations negatively affect amounts of variations in gain and power output of a PA module. To minimize these impedance variations for the second frequency range, an output impedance matching module (or frequency impedance correction module) may be incorporated in the RF amplifier system, as shown in FIG. 15.

In FIG. 15, a PA module 440 is shown and includes splitters 442-446, PAs 450-456 and an output module 463. The PA module 440 may be used for various operating center frequencies (e.g., 27 MHz and 40 MHz). Each of the PAs 450-456 may include first capacitances C1-C4, input transformers T1-T4, shunt capacitances C5-C12, shunt resistances R1-R8, transistors Q1-Q8, and output transformers T5-T8. In one frequency implementation, the first capacitances C1-C4 are not included. In other frequency implementations, (e.g., 27 MHz and 40 MHz), shunt capacitances as shown in FIG. 15 are included at outputs of the input transformers T1-T4. The shunt resistances R1-R8 provide a real impedance load and together with the series capacitors C5-C12 provide isolation between the pairs of transistors in each of the push-pull Pas 200-203, which prevents spurious outputs, especially at frequencies near f/2. The shunt resistances R1-R8 and shunt capacitances C5-C12 are connected (i) between outputs of the input transformers T1-T4 and (ii) the second capacitances C13-C20. The shunt resistances R1-R8 and shunt capacitances C5-C12 connect the outputs of the input transformers T1-T4 to a ground reference 457. Although some of the alphanumeric references of the circuit elements of FIG. 15 match the alphanumeric references of circuit elements in other RF amplifier systems disclosed herein, the impedances may be different.

The second transformers T5-T8 may each have a turns ratio of, for example, 4:1 to provide increased impedance at the output of the second transformers T5-T8. The second transformers T5-T8 may have a 4:1 ratio to allow for wideband CLC compensation. The output module 463 includes shunt capacitances C21-C24 and transmission lines 456-462 for each of the PAs 450-456. Outputs of the transmission lines 456-462 are galvanically and directly connected to each other at an output terminal 464 without isolation. Especially for the 27 MHz quad-PA implementation, the output module (i.e. combiner, impedance matching and frequency impedance compensation module) has frequency impedance compensation because the output power variation over the AFT bandwidth is high.

Since the PAs 450-456 are operating in the second frequency range (e.g., with a center frequency of 27 MHz or 40 MHz), impedances of the transistors Q1-q8 and the second transformers T5-T8 are different than when operating in the first frequency range. An LC circuit 465 is part of the combiner, impedance matching and frequency impedance compensation module or output module. The transistor drain impedances increase when operating in the second or lower frequency range. As an example, transistor drain impedance may increase 15% from when operating at 60 MHz to when operating at 40 MHz.

The LC circuit 465 is connected to the output terminal 464 and includes a first inductance L1 and a shunt capacitance C25. The first inductance L1 includes a first end 470 and a second end 472. The shunt capacitance C25 includes a first end 474 and a second end 476. The first end 470 is connected to the output terminal 464. The second end 472 is connected to the first end 474. A second end 476 is connected to the ground reference 457. The second end 472 and the first end 474 are connected to and provide power to a power combiner and/or load.

The LC circuit 465 and the output module 463 provide an output network and may be combined into a single frequency impedance correction (FIC) module. The FIC module applies frequency impedance correction opposite to the impedance variation of the transistors Q1-Q8 and transformers T5-T8 over the associated AFT bandwidth. The frequency correction provided by the LC circuit 465 and the output module 463 can be seen in FIG. 16. The LC circuit 465 is an integral part of the output module and the PA module. The components of the LC circuit 465 are needed to provide the required frequency impedance correction (as well as simultaneously the combining and load line impedance matching functions). The 27 MHz frequency PA module implementation has frequency impedance correction.

The LC circuit 465 provides a single module connected to the outputs of the output module 463. This minimizes impedance variations and the number of inductances and capacitances incorporated in a RF amplifier system.

The LC circuit 465 and/or the corresponding output module compensates for impedance variations in the transistors Q1-Q8 and in the second transformers T5-T8. This minimizes overall impedance variations over the AFT bandwidth of the RF amplifier system, which provides a constant load line (i.e. minimal variations in power output and gain). The compensation is provided over an AFT bandwidth to minimize impedance variations at the outputs of the PAs 450-456. Certain inductance and capacitance values of the LC circuit 465 and/or corresponding output module provide variation in impedance with frequency opposite to the impedance variation with frequency of the transistors Q1-Q8 and the second transformers T5-T8. This allows the combined output network (combination of PA outputs at the output terminal 464) to provide an output power response and a corresponding current demand with minimal variations over the AFT bandwidth. The components of the output module provide the impedance correction as well as the combining and load line matching functions (corresponding power supply current demand with minimal variations over the AFT bandwidth).

The four-PA configuration of FIG. 15 provides a constant class of operation. Although the impedance variations in the transistors Q1-Q8 and the second transformers T5-T8 change with change in frequency, the impedance variations of the LC circuit 465 compensates for these changes preventing the class of operation from changing.

The four-PA configuration of FIG. 15 may provide reduced PA supply current variations for 27 MHz and 40 MHz over the traditional variable class amplifier system. The supply current variations may be, for example, 5.9%, as opposed to 14%. This reduced variation is supply current is provided due to the elimination of CLC networks, increased transformer turns ratios of 4:1, direct combining of PA outputs, and incorporation of PA and output impedance matching components, as shown.

Figure 16:
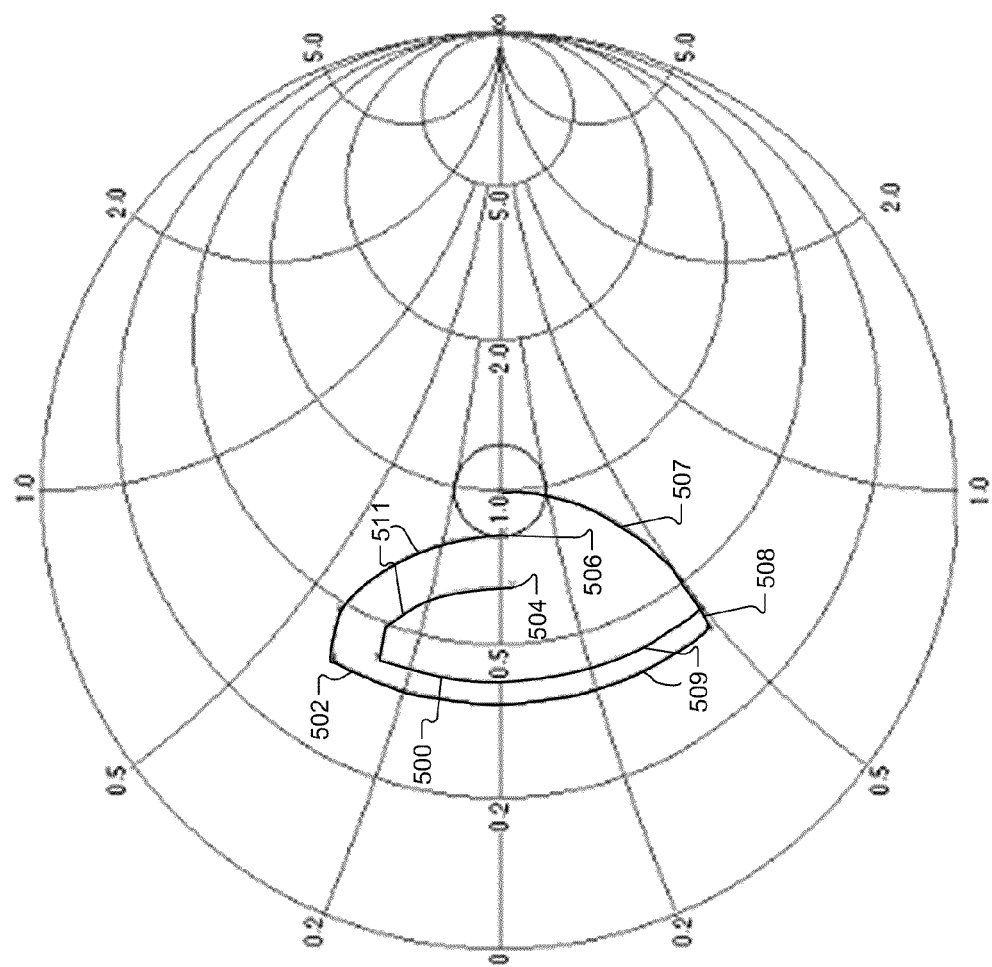
FIG. 16 is a Smith chart illustrating example impedances for a radio frequency amplifier system having the output impedance matching of FIG. 15 and operating in the second frequency range.

Referring now also to FIG. 16, a Smith chart illustrating example impedances for the PAs of FIG. 15 incorporating the LC circuit 465 and operating in the second frequency range (or with a center frequency of, for example, 40 MHz) is shown. Two impedance curves 500, 502 are shown. The first impedance curve 500 is shown for the RF amplifier system operating at a first frequency (or for example 38.7 MHz). The second impedance curve is shown for the RF amplifier system operating at a second frequency (or for example 42.7 MHz).

Normalized points between segments of the curves 500, 502 refer to impedances at different points along the output network provided by the output module 463 and the LC circuit 465. For example, first curve segments 507 are associated with capacitances C21-C24. Second curve segments 508 are associated with impedances of the transmission lines 462. Third curve segments 509 are associated with the inductances L2. Fourth curve segments 511 are associated with the capacitance C25.

A first point 504 on the first curve 500 is an impedance value at an output of the LC circuit 465 when the frequency of the input signal is at 38.7 MHz. A second point 506 on the second curve 502 is an impedance value at an output of the LC circuit 465 when the frequency of the input signal is at 42.7 MHz. As an example, the output impedance of each of the output transformers for the first point 504 may be 120.08 Ω (or 30.02 Ω combined). The output impedance of each of the output transformers for the second point 506 may be 143.08 Ω (or 35.77 Ω combined).

Two example value sets are provided below. The values may be varied per application. For a first set of LC values (e.g., 150.0 nano-Henry (nH) and 90.0 pico-farad (pF)), the LC circuit 465 may transform 30.02 Ω to 50.0 Ω at 38.7 MHz and 35.77 Ω to 50.0 Ω at 42.7 MHz. For a second set of LC values (e.g., 158.0 nH and 98.0 pF), the LC circuit 465 may transform 32.8 Ω to 50.0 Ω at 38.7 MHz and 41.59 Ω to 50.0 Ω at 42.7 MHz. The LC impedances of the LC circuit 465 provide compensation for quad-combined PA outputs operating at a center frequency in the second frequency range (e.g., a center frequency of 40 MHz). This effectively corrects and removes or minimizes power output and current demand variations of variable class power amplifier operation.

Figure 18:
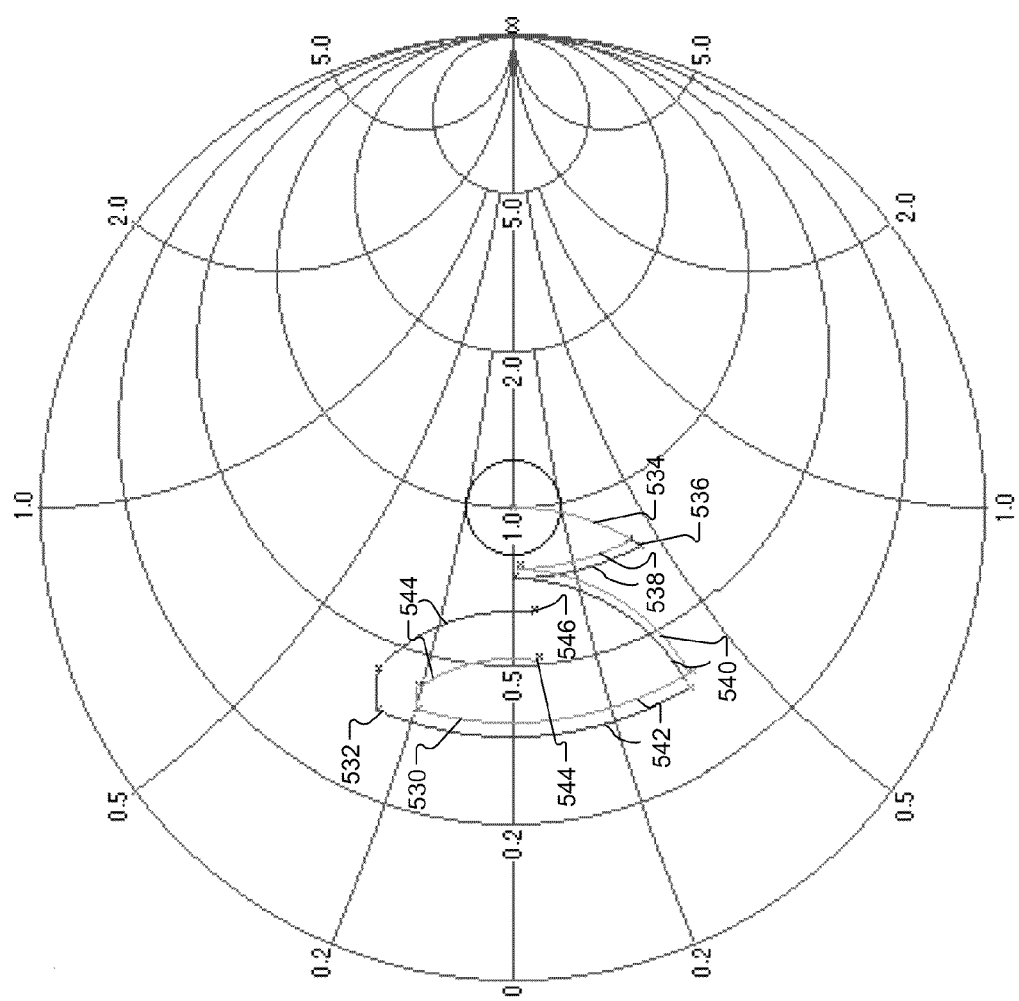
FIG. 18 is a Smith chart illustrating example impedances for a radio frequency amplifier system having the output impedance matching of FIG. 15, the variable class module of FIG. 17 and operating in the second frequency range.

When tuning the configuration of FIG. 15 for a flat frequency response, variable class adjustment can be lost. To tune for variable class operation, the configuration of FIG. 15 may be modified to include a variable class module 510 as shown in FIG. 17. The Smith chart of FIG. 18 shows that the frequency impedance correction is preserved while providing a variable load line to PAs and hence variable class operation.

Referring now to FIGS. 15 and 17, the output module 463 with the LC circuit 465 of FIG. 15 and a variable class module 510 are shown. The output module 463 includes the shunt capacitances C21-C24 and the transmission lines 456-462. Outputs of the transmission lines 456-462 are galvanically and directly connected to each other at the output terminal 464 without isolation. The LC circuit 465 is connected to the output terminal 464 and includes the first inductance L1 and the shunt capacitance C25. The output module 463, the LC circuit 465 and the variable class module 510 provide an output network.

The variable class module 510 is connected to the output of the LC circuit 465. The variable class module 510 includes a second inductance L2 and a shunt capacitance C26. The second inductance L2 includes a first end 512 and a second end 514. The shunt capacitance C26 includes a first end 516 and a second end 518. The first end 512 is connected to the second end 472 and to the first end 474. The second end 514 is connected to a first end 516. The second end 518 is connected to the ground reference 457. The second end 514 and the first end 516 are connected to and provide power to a power combiner and/or load.

The variable class module 510 provides a further degree of freedom adjustment, by allowing the RF amplifier system to be pre-adjusted to operate either in the Class AB mode, the Class E mode and modes therebetween. This provides continuously variable PA class operation between the Class AB mode and the Class E mode. Values of the second inductance L2 and the shunt capacitance C26 may be varied to provide the different operating modes.

In general, the lower the output impedance presented by the variable class module 510 to the output of the four-PA configuration of FIG. 17, the more the four PA configuration operates as a Class E system up to a point. Also the higher the output impedance presented by the variable class module 510 to the output of the four-PA configuration, the more the four PA configuration operates as a Class AB system up to a point. The output impedance may be set closer to Class AB and/or E by changing the impedances of the variable class module 510.

The impedance values of the output impedance matching modules of FIGS. 15, 17 and the variable class module 510 may be set based on transistor load line (or RF output power) requirements, AFT flatness requirements, efficiency requirements, or PA compression point requriements. The impedance values depend on the drain impedances of the transistors Q1-Q8 and the output impedances of the second transformers T5-T8 for the specific frequency band.

In FIG. 18, a Smith chart illustrating example impedances for a RF amplifier system incorporating the LC circuit 465 of FIG. 15, the variable class module 510 of FIG. 17, and operating in the second frequency range is shown. Two impedance curves 530, 532 are shown. The first impedance curve 530 is shown for the RF amplifier system operating at a first frequency (e.g., 38.7 MHz). The second impedance curve 532 is shown for the RF amplifier system operating at a second frequency (e.g., 42.7 MHz).

Normalized points between segments of the curves 500, 502 refer to impedances at different points along the output network provided by the modules 463, 510. For example, first curve segments 534 are associated with capacitances C21-C24. Second curve segments 536 are associated with impedances of the transmission lines 456-462. Third curve segments 538 are associated with the inductance L1. Fourth curve segments 540 are associated with the shunt capacitance C25. Fifth curve segments 542 are associated with the inductance L2. Sixth curve segments 544 are associated with the shunt capacitance C26.

A first point 544 on the first curve 530 is an impedance value when the frequency of the input signal is at 38.7 MHz. A second point 546 on the second curve 532 is an impedance value when the frequency of the input signal is at 42.7 MHz.

As an example, the output impedance of each of the second transformers for the first point may be 103.44 Ω (or 25.86 Ω combined). The output impedance of each of the second transformers for the second point may be 127.6 Ω (or 31.9 Ω combined).

Figure 19:
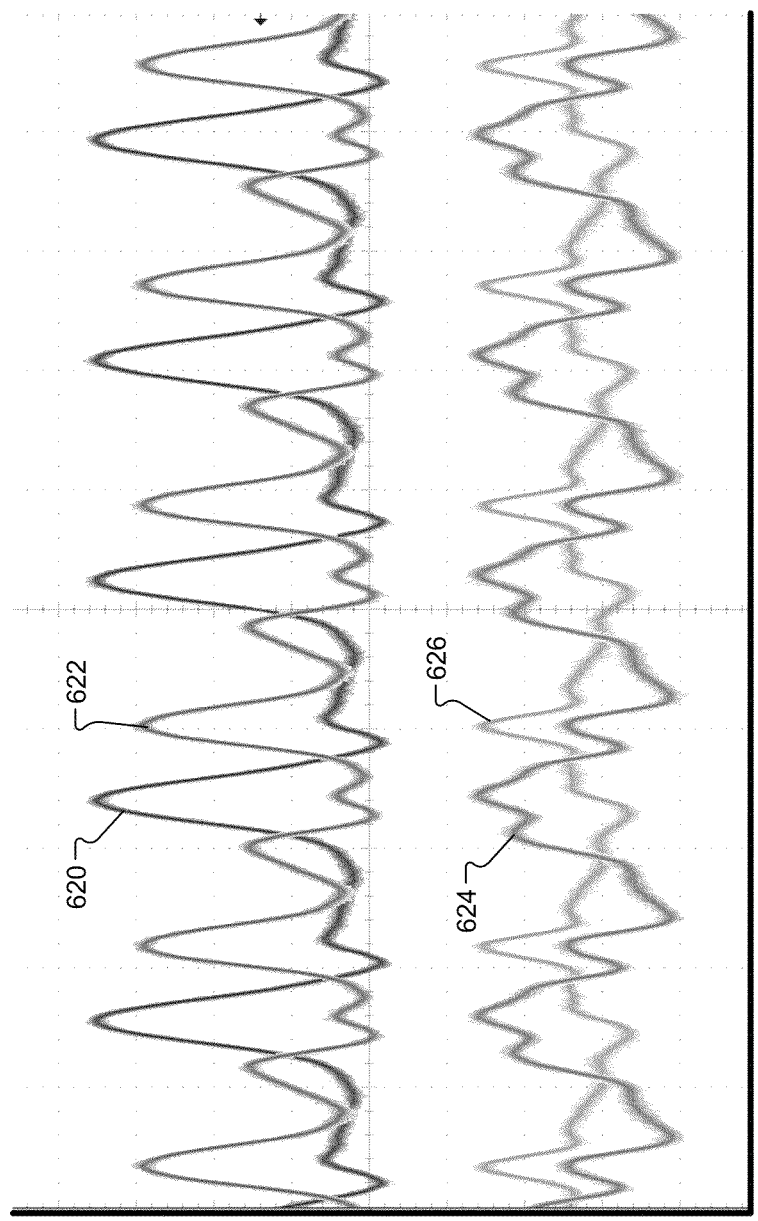
FIG. 19 is a plot of drain and gate voltages of power amplifier transistors for a radio frequency amplifier system in accordance with the present disclosure.

In FIG. 19, a plot of drain and gate voltages of PA transistors are shown for a RF amplifier system operating in the second frequency range. In the example shown, the center frequency of the input signal supplied to the RF amplifier system is 27 MHz. The RF amplifier system may be any one of the RF amplifier systems disclosed above. The drain and gate voltages may be of, for example, the transistors Q1-Q8 of FIGS. 7-8 and 15. Four voltage plots are shown. The first and second voltage plots 620, 622 are drain voltages for first and second transistors of a PA. The third and fourth voltage plots 624, 626 are gate voltages for the first and second transistors. As can be seen from the plots the drain voltages for the first transistor are asymmetrical to the drain voltages of the second transistor. Also, the gate voltages of the first transistor are asymmetrical to the gate voltages of the second transistor.

These asymmetrical characteristics of the drain and gate voltages reduced output power and efficiency of the corresponding PA. In order to minimize the asymmetrical behavior of the PA and/or provide symmetrical drain and gate voltages, transistor isolation may be provided, as shown in FIG. 21.

Referring again to the implementation of FIG. 15, which provides transistor isolation. In addition to other implementations disclosed herein, the implementation of FIG. 15 may be applied to open cable loads. Impedance transformation and isolation between gates of the transistors Q1-Q8 may be provided by the shunt resistances R1-R8 and the shunt capacitances C5-C12. In another frequency implementations (e.g., 27 MHz and 40 MHz), shunt capacitances as shown in FIG. 15 are included at outputs of the input transformers T1-T4. The shunt resistances R1-R8 provide a real impedance load and together with the series capacitors C5-C12 provide isolation between the pairs of transistors in each of the push-pull PAs 200-203, which prevents spurious outputs, especially at frequencies near f/2. This additional isolation is helpful because of the limited transistor reverse isolation (S12), mainly caused by Cgd. Input ends of the resistances R1, R3, R5, R7 are connected between the secondary windings of the input transformers T1-T4 and the capacitances C13, C15, C17, C19. Input ends of the resistances R2, R4, R6, R8 are connected between the secondary windings of the input transformers T1-T4 and the capacitance C14, C16, C18, C20.

The shunt capacitances C5-C12 also increase the isolation between each pair of push-pull transistors Q1-Q8 and change the phase of the reverse RF resulting in a 3% improvement in overall PA efficiency. The shunt capacitances C5-C12 also improve stability in, for example, the 27 MHz implementation. Signal lines between the transistors Q1-Q8 may be of equal length (i.e. symmetric).

Figure 20:
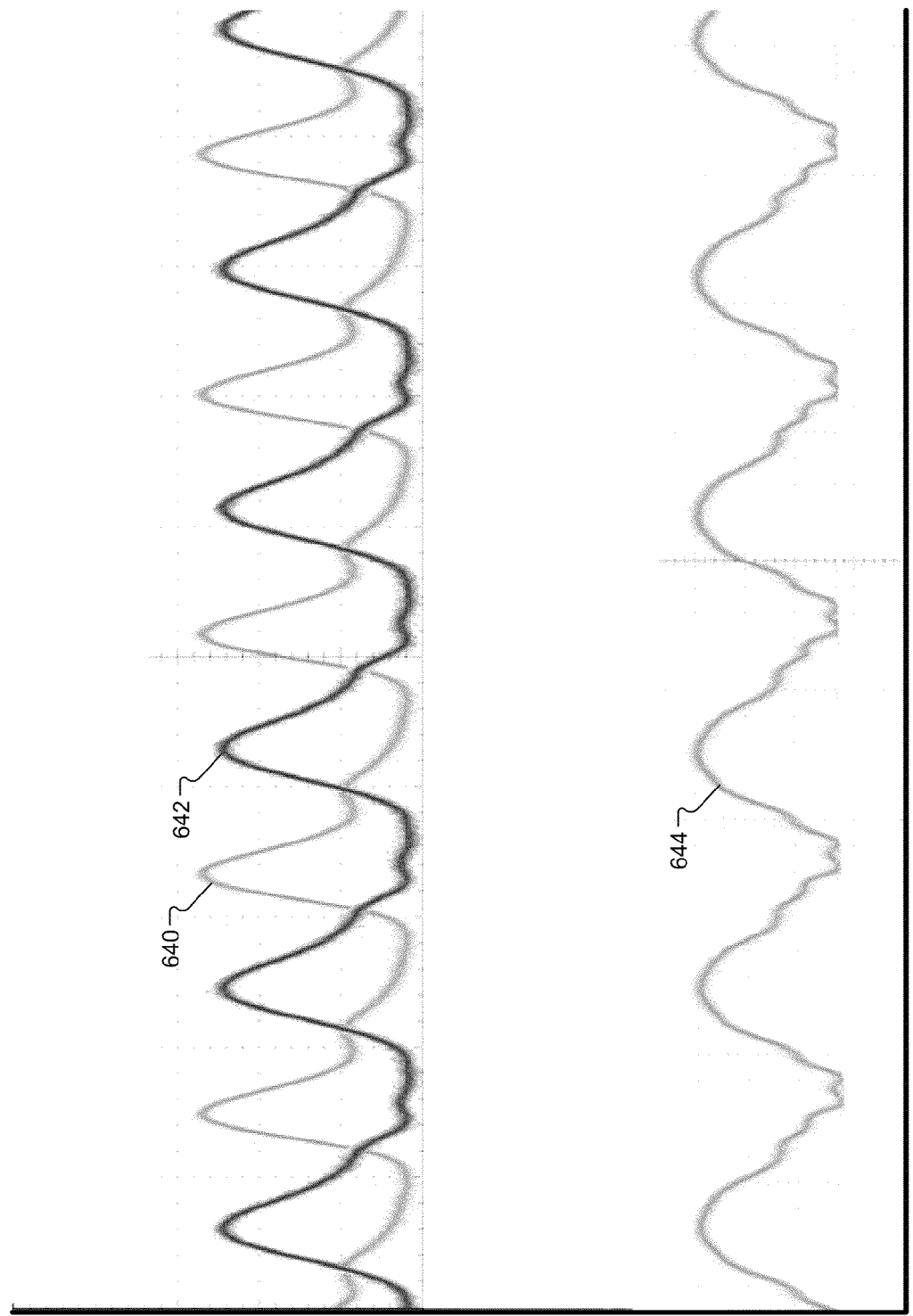
FIG. 20 is a plot of drain and gate voltages for a radio frequency amplifier system with transistor isolation in accordance with the present disclosure.

In FIG. 20, a plot of drain and gate voltages for a RF amplifier system including transistor isolation is shown. In the example shown, the center frequency of the input signal supplied to the RF amplifier system is 27 MHz. The RF amplifier system may be any one of the RF amplifier systems described above. The drain and gate voltages may be of, for example, the transistors Q1-Q8 of FIGS. 7-8 and 15. Three voltage plots are shown. The first and second voltage plots 640, 642 are drain voltages for the first and second transistors of a PA. The third voltage plot 644 is of a gate voltage for the first transistor. A similar plot may be provided for the gate of the second transistor. As can be seen from the plots the drain voltages for the first transistor are symmetrical to the drain voltages of the second transistor. Although not shown, the gate voltages of the first transistor are symmetrical to the gate voltages of the second transistor. By providing gate-to-gate isolation the shunt capacitances C5-C12 prevent PA instability and the PA operates without spurious outputs. This can improve operating efficiency and increase output power of the RF amplifier system.

PA instability can be worse at a lower frequencies (e.g., 27 MHz) than at higher frequencies (e.g., 60 MHz) because the transistor gain and hence PA gain (S21) is higher. For this reason, higher isolation is used when operating at low frequencies, for example 40 MHz or 27 MHz, than at higher frequencies, for example 60 MHz. As a result, the shunt capacitances C5-C12 may not be used or may be minimized for, as an example, the 60 MHz implementation.

The implementations disclosed herein include 60 MHz parallel and directly combined PA modules with wide bandwidth for AFT applications. The implementations disclosed herein include a 27 MHz/40 MHz parallel and directly combined PA module with wide bandwidth for AFT applications including an FIC module for output impedance variation correction. The techniques disclosed herein also include a variable class techniques, which allows PA modules for the 27 MHz, 40 MHz and 60 MHz implementations to vary class of operation.

PA stability techniques are disclosed, which prevent individual push pull PAs of the type used in 27 MHz, 40 MHz and 60 MHz implementations from becoming unstable at 27 MHz and producing f/2 spurs at 60 MHz, when driving open or short circuit loads of various phase angles.

A system level stability technique is provided, which, when directly combining large numbers of PAs of the type used in 27 MHz, 40 MHz and 60 MHz implementations, does not produce multiple spurious outputs. The spurious outputs are not produced when driving open or short circuit loads of various phase angles. Power splitting in these implementations is fully isolated to prevent the individual PAs from interacting through S12 mechanisms. The S12 mechanisms can cause random multiple spurious outputs when driving open or short circuit loads of various phase angles. The 27 MHz, 40 MHz and 60 MHz implementations and other implementations disclosed herein including the corresponding PA modules may be used in an RF deck having multiple RF amplifier systems.

The above-disclosed RF amplifier systems and corresponding PAs provide output network designs with minimal inductances, capacitances, and/or impedances while providing wideband operation, improved operating efficiency. The output network designs have a minimal number of impedance transformations, which provides a wide operating bandwidth and improved operating efficiency. By providing output network designs with minimal inductances, capacitances, and/or impedances, the RF amplifier systems have minimal circuit size and for this reason improved power density (power per circuit area). A minimal number of circuit components minimizes RF losses, which improves operating efficiencies. Operating temperatures are reduced due to improved operating efficiencies. In addition, reliability is improved due to a minimal number of circuit components and operating temperatures.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The terminology used herein is for the purpose of describing particular example implementations only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element herein is referred to as being "on," "engaged to," "connected to," or "coupled to" another element, it may be directly on, engaged, connected or coupled to the other element, or intervening elements may be present. In contrast, when an element is referred to as being "directly on," "directly engaged to," "directly connected to," or "directly coupled to" another element, there may be no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, and/or modules, these elements, components, and/or modules should not be limited by these terms. These terms may be only used to distinguish one element, component, or module from another element, component, or module. Terms such as "first," " "second," and other numerical terms when used herein do not imply a sequence or order unless clearly indicated by the context. Thus, a first element, component, or module discussed below could be termed a second element, component, or module without departing from the teachings of the example implementations.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A radio frequency system, comprising:
   a first power splitter configured to receive a first radio frequency signal and generate a first output signal and a second output signal;
   a first push-pull power amplifier configured to amplify the first output signal, wherein the first push-pull power amplifier comprises (i) a first set of transistors including at least two radio frequency power transistors, and (ii) a first output transformer;
   a second push-pull power amplifier configured to amplify the second output signal, wherein the second push-pull power amplifier comprises (i) a second set of transistors including at least two radio frequency power transistors, and (ii) a second output transformer;
   a second power splitter configured to receive a second radio frequency signal and generate a third output signal; and
   a third push-pull power amplifier configured to amplify the third output signal, wherein the third push-pull power amplifier comprises a third set of transistors including at least two radio frequency power transistors,
   wherein an output of the first output transformer is galvanically and directly connected to an output of the second output transformer at an output terminal, and
   wherein an output of the third push-pull power amplifier is galvanically and directly connected to the output terminal.

2. The radio frequency system of claim 1, further comprising a fourth push-pull power amplifier configured to amplify a fourth output signal, wherein the fourth push-pull power amplifier comprises a fourth set of transistors including at least two radio frequency power transistors,
   wherein the second power splitter is configured to generate a fourth output signal, and
   wherein an output of the fourth push-pull power amplifier is galvanically and directly connected to the output terminal.

3. The radio frequency system of claim 1, further comprising a first shunt capacitance connecting the output terminal to a ground reference.

4. A radio frequency system, comprising:
   a first power splitter configured to receive a first radio frequency signal and generate a first output signal and a second output signal;
   a first push-pull power amplifier configured to amplify the first output signal, wherein the first push-pull power amplifier comprises (i) a first set of transistors including at least two radio frequency power transistors, and (ii) a first output transformer;

a second push-pull power amplifier configured to amplify the second output signal, wherein the second push-pull power amplifier comprises (i) a second set of transistors including at least two radio frequency power transistors, and (ii) a second output transformer; and a variable class module including:
an inductor connected between an output terminal and a load of the radio frequency system; and
a second shunt capacitance connecting an output of the inductor to a ground reference, wherein an output of the first output transformer is galvanically and directly connected to an output of the second output transformer at an output terminal.

5. The radio frequency system of claim 4, wherein:
the radio frequency system is configured to operate in a selected mode characteristic of one of a plurality of power amplifier classes based on a configuration of the variable class module; and
the configuration of the variable class module is modifiable to operate in the selected mode.

6. A radio frequency system, comprising:
a first power splitter configured to receive a first radio frequency signal and generate a first output signal and a second output signal;
a first push-pull power amplifier configured to amplify the first output signal, wherein the first push-pull power amplifier comprises (i) a first set of transistors including at least two radio frequency power transistors, and (ii) a first output transformer,
wherein the first push-pull power amplifier includes a first input transformer configured to receive the first output signal and includes a first output and a second output,
wherein the first output of the first input transformer is connected to (i) a first transistor of the first set of transistors via a first capacitance, and (ii) a ground reference via a first resistance;
wherein the second output of the first input transformer is connected to (i) a second transistor of the first set of transistors via a second capacitance, and (ii) the ground reference via a second resistance; and
a second push-pull power amplifier configured to amplify the second output signal, wherein the second push-pull power amplifier comprises (i) a second set of transistors including at least two radio frequency power transistors, and (ii) a second output transformer;
wherein the second push-pull power amplifier includes a second input transformer configured to receive the second output signal and includes a first output and a second output,
wherein the first output of the second input transformer is connected to (i) a first transistor of the second set of transistors via a third capacitance, and (ii) the ground reference via a third resistance, and
wherein the second output of the second input transformer is connected to (i) a second transistor of the second set of transistors via a fourth capacitance, and (ii) a ground reference via a fourth resistance; and
wherein an output of the first output transformer is galvanically and directly connected to an output of the second output transformer at an output terminal.

7. A radio frequency system comprising:
a first power splitter configured to receive a first radio frequency signal and generate a first output signal and a second output signal;
a first push-pull power amplifier configured to amplify the first output signal, wherein the first push-pull power amplifier comprises (i) a first set of transistors including at least two radio frequency power transistors, and (ii) a first output transformer;
a second push-pull power amplifier configured to amplify the second output signal, wherein the second push-pull power amplifier comprises (i) a second set of transistors including at least two radio frequency power transistors, and (ii) a second output transformer;
a first inductor connected between an output terminal and a load of the radio frequency system; and
a first shunt capacitance connecting an output of the inductor to a ground reference,
wherein an output of the first output transformer is galvanically and directly connected to an output of the second output transformer at an output terminal.

8. The radio frequency system of claim 7, wherein the first push-pull power amplifier comprises:
a first transistor;
a second transistor;
a second capacitance connected to the first transistor;
a first resistance connecting the second capacitance to the ground reference;
a third capacitance connecting the second capacitance to the ground reference;
a fourth capacitance connected to the second transistor;
a second resistance connecting the fourth capacitance to the ground reference; and
a fifth capacitance connecting the fourth capacitance to the ground reference.

9. The radio frequency system of claim 7, further comprising:
a second shunt capacitance connecting an output of the first push-pull power amplifier to the ground reference; and
a third shut capacitance connecting an output of the second push-pull power amplifier to the ground reference.

10. The radio frequency system of claim 9, further comprising a variable class module comprising:
a second inductor connected between the first inductor and the load; and
a fourth shunt resistance connecting an output of the second inductor to the ground reference.

11. The radio frequency system of claim 10, wherein:
the radio frequency system is configured to operate in a selected mode characteristic of one of a plurality of power amplifier classes based on a configuration of the variable class module; and
the configuration of the variable class module is modifiable to operate in the selected mode.

12. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal,
wherein power from the first set of power amplifiers is supplied to a load via the first output terminal, and wherein the frequency of the input signal varies −5-10% from a center frequency.

13. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal,
wherein:
the first set of power amplifiers includes an output module; and
the output module includes a plurality of capacitances connected between the outputs of the first set of power amplifiers and a ground reference,
wherein power from the first set of power amplifiers is supplied to a load via the first output terminal.

14. The radio frequency amplifier system of claim 13, wherein the output module is void of an inductance and includes only one capacitance per power amplifier in the first set of power amplifiers.

15. The radio frequency amplifier system of claim 13, further comprising a variable class module connected to the first output terminal, wherein the radio frequency amplifier system is configured to operate in a selected mode characteristic of one of a plurality of power amplifier classes based on a configuration of the variable class module, and wherein the configuration of the variable class module is modifiable to operate in the selected mode.

16. The radio frequency amplifier system of claim 15, wherein the variable class module comprises:
an inductance having a first end and a second end, wherein the first end is connected to the first output terminal; and
a second capacitance connected between the second end and the ground reference,
wherein the power from the first set of power amplifiers is supplied to the load via the second end of the inductance.

17. The radio frequency amplifier system of claim 13, the output module comprises:
a first inductance having a first end and a second end, wherein the first end is connected to the first output terminal; and
a second capacitance connected between the second end and the ground reference,
wherein the power from the first set of power amplifiers is supplied to the load via the second end of the first inductance.

18. The radio frequency amplifier system of claim 17, further comprising a variable class module connected to the output module, wherein the radio frequency amplifier system is configured to operate in a selected mode characteristic of one of a plurality of power amplifier classes based on a configuration of the variable class module, and wherein the configuration of the variable class module is modifiable to operate in the selected mode.

19. The radio frequency amplifier system of claim 18, wherein the variable class module comprises:
a second inductance having a first end and a second end, wherein the first end of the second inductance is connected to the second end of the first inductance; and
a third capacitance connected between the second end of the second inductance and the ground reference,
wherein the power from the first set of power amplifiers is supplied to the load via the second end of the second inductance.

20. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal,
wherein power from the first set of power amplifiers is supplied to a load via the first output terminal, and
wherein:
the first set of power amplifiers includes three power amplifiers;
a center frequency of the input signal is greater than 40 MHz;
a turns ratio of each transformer in each of the first set of power amplifiers is 3:1; and
an output impedance of each of the first set of power amplifiers at the first output terminal is 145-155 w.

21. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal,
wherein power from the first set of power amplifiers is supplied to a load via the first output terminal,
wherein:
the first set of power amplifiers comprises four power amplifiers;
a center frequency of the input signal is greater than 40 MHz, a turns ratio of each transformer in each of the first set of power amplifiers is one of 3:1 and 4:1; and
an output impedance of each of the first set of power amplifiers at the first output terminal is 195-205 w.

22. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal,
wherein power from the first set of power amplifiers is supplied to a load via the first output terminal, and
wherein:
the first set of power amplifiers comprises four power amplifiers;
a center frequency of the input signal is less than 60 MHz and greater than 40 MHz;
a turns ratio of each transformer in each of the first set of power amplifiers is 4:1; and an output impedance of each of the first set of power amplifiers at the first output terminal is 195-205 w.

23. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal;
an output module connected to the first output terminal and converting a first impedance at the first output terminal to a second impedance; and
a variable class module connected to the output module and configured to set an operating class of the radio frequency amplifier system,
wherein power from the first set of power amplifiers is supplied to a load via the first output terminal, and
wherein a center frequency of the input signal is less than 60 MHz.

24. A radio frequency amplifier system comprising:
an input module configured to receive and amplify an input signal to generate an amplified output signal, wherein a frequency of the input signal varies within a predetermined frequency range; and
a first set of power amplifiers, wherein each of the first set of power amplifiers comprises an output and is configured to receive the amplified output signal, and wherein the outputs of the first set of power amplifiers are galvanically and directly connected to each other at a first output terminal; and
a power combiner receiving an output of the first set of power amplifiers and an output of a second set of power amplifiers,
wherein power from the first set of power amplifiers is supplied to a load via the first output terminal;
wherein a circuit between (i) the first set of power amplifiers and the second set of power amplifiers and (ii) the power combiner, is void of an inductance, and
wherein a center frequency of the input signal is greater than or equal to 40 MHz.

25. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal, and
a variable class module connected to the first output terminal and configured to set an operating class of the radio frequency amplifier system; and
a power combiner receiving an output of the first set of power amplifiers and an output of a second set of power amplifiers,
wherein power from the first set of power amplifiers is supplied to a load via the first output terminal,
wherein a circuit between (i) the first set of power amplifiers and the second set of power amplifiers, and (ii) the power combiner is void of an inductance other than an inductance in the variable class module, and
wherein a center frequency of the input signal is greater than or equal to 40 MHz.

26. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal;
a second set of power amplifiers, wherein each of the second set of power amplifiers comprises an output and is configured to receive the amplified output signal, and wherein each of the outputs of the second set of power amplifiers are galvanically and directly connected to each other at a second output terminal; and
a non-isolated combiner configured to combine signals received from the first output terminal and the second output terminal,
wherein power from the first set of power amplifiers is supplied to a load via the first output terminal.

27. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal; and
a circuit connected to the output terminal and configured to maintain an output power of the radio frequency amplifier system at a predetermined output power level −0.5% of the predetermined output power level while frequency of the input signal varies,
wherein power from the first set of power amplifiers is supplied to a load via the first output terminal.

28. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal; and
a circuit connected to the output terminal and configured to maintain a current level out of the radio frequency amplifier system at a predetermined current level −0.5% of the predetermined current level while frequency of the input signal varies,
wherein power from the first set of power amplifiers is supplied to a load via the first output terminal.

29. A radio frequency amplifier system comprising:
an input module configured to receive and amplify an input signal to generate an amplified output signal, wherein a frequency of the input signal varies within a predetermined frequency range;
a first set of power amplifiers, wherein each of the first set of power amplifiers comprises an output and is configured to receive the amplified output signal, and wherein the outputs of the first set of power amplifiers are galvanically and directly connected to each other at a first output terminal; and a plurality of transmission traces, wherein each of the plurality of transmission traces connects one of the outputs of one of the first set of power amplifiers to the output terminal, and wherein paths along the plurality of transmission traces are void of a capacitance-inductance-capacitance network, wherein power from the first set of power amplifiers is supplied to a load via the first output terminal.

30. A radio frequency amplifier system comprising:

an input module configured to receive and amplify an input signal to generate an amplified output signal, wherein a frequency of the input signal varies within a predetermined frequency range;

a first set of power amplifiers, wherein each of the first set of power amplifiers comprises an output and is configured to receive the amplified output signal, and wherein the outputs of the first set of power amplifiers are galvanically and directly connected to each other at a first output terminal; and wherein power from the first set of power amplifiers is supplied to a load via the first output terminal, and wherein each of the first set of power amplifiers includes:
a first transistor comprising a first control terminal;
a second transistor comprising a second control terminal;
a first capacitance connected between the first control terminal and a ground reference; and
a second capacitance connected between the second control terminal and the ground reference.

31. The radio frequency amplifier system of claim 30, wherein each of the first set of power amplifiers further comprises:

an input transformer having a first output and a second output, wherein the first capacitance is connected to the first output of the input transformer, and the second capacitance is connected to the second output of the input transformer; and an output transformer having a first input and a second input, wherein the first input of the output transformer is connected to a drain of the first transistor, and the second input of the output transformer is connected to a drain of the second transistor.

32. The radio frequency amplifier system of claim 31, further comprising:

a first resistance connected to the first output of the input transformer and to the ground reference; and a second resistance connected to the second output of the input transformer and to the ground reference.

33. The radio frequency amplifier system of claim 32, further comprising:

a third capacitance connected to the first output of the input transformer and to the ground reference; and a fourth capacitance connected to the second output of the input transformer and to the ground reference, wherein the third capacitance and the first resistance are connected in parallel between the first output of the input transformer and the ground reference, and wherein the fourth capacitance and the second resistance are connected in parallel between the second output of the input transformer and the ground reference.

* * * * *